(12) United States Patent
Kasai et al.

(10) Patent No.: US 11,056,615 B2
(45) Date of Patent: Jul. 6, 2021

(54) METHOD FOR MANUFACTURING LIGHT EMITTING MODULE WITH CONCAVE SURFACE LIGHT GUIDE PLATE

(71) Applicant: NICHIA CORPORATION, Anan (JP)

(72) Inventors: Daisuke Kasai, Tokushima (JP); Akira Miki, Anan (JP); Toru Hashimoto, Tokushima (JP); Shinichi Daikoku, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/585,810

(22) Filed: Sep. 27, 2019

(65) Prior Publication Data

US 2020/0105973 A1 Apr. 2, 2020

(30) Foreign Application Priority Data

Sep. 28, 2018 (JP) .............................. JP2018-185847
Oct. 9, 2018 (JP) .............................. JP2018-191219

(51) Int. Cl.
*H01L 33/24* (2010.01)
*G02F 1/13357* (2006.01)
(Continued)

(52) U.S. Cl.
CPC ........ *H01L 33/24* (2013.01); *G02F 1/133603* (2013.01); *H01L 33/505* (2013.01); *H01L 33/62* (2013.01); *H01L 2933/0041* (2013.01)

(58) Field of Classification Search
CPC ........ H01L 33/24; H01L 33/505; H01L 33/62; H01L 2933/0041; H01L 33/58;
(Continued)

(56) References Cited

U.S. PATENT DOCUMENTS 7,258,816 B2 * 8/2007 Tamaki ................. C04B 35/584
252/301.4 F
8,530,250 B2 * 9/2013 Ichikawa ................ H01L 33/62
438/26
(Continued)

FOREIGN PATENT DOCUMENTS

JP 2007311445 A 11/2007
JP 2009140663 A 6/2009
(Continued)

*Primary Examiner* — John P. Dulka
(74) *Attorney, Agent, or Firm* — Hunton Andrews Kurth LLP

(57) ABSTRACT

In order to obtain a light emitting module with a less unevenness of luminance, provided is a method for manufacturing a light emitting module comprising: preparing a light emitter and a light-transmissive light guide plate, the light emitter comprising a light emitting element, the light guide plate having a first main surface serving as a light emitting surface from which light is emitted outside and a second main surface located opposite to the first main surface and having a concave portion, the concave portion comprising a side surface and a bottom surface that is smaller than an opening of the concave portion in a cross-sectional view; fixing the light emitter to the bottom surface of the concave portion via a bonding member; and forming a wiring at an electrode of the light emitting element.

20 Claims, 20 Drawing Sheets

(51) Int. Cl.
*H01L 33/50* (2010.01)
*H01L 33/62* (2010.01)

(58) Field of Classification Search
CPC ....... H01L 2933/0058; G02F 1/133603; G02F 2001/133614; G02F 2001/133601; G02F 1/133605; G02F 1/133608; G02B 6/0021; G02B 6/0036; G02B 6/0078
See application file for complete search history.

(56) References Cited

U.S. PATENT DOCUMENTS

| | | | |
|---|---|---|---|
| 10,768,353 B2* | 9/2020 | Hayashi | ............... G02B 6/0026 |
| 10,775,554 B2* | 9/2020 | Kawano | ................... F21V 5/008 |
| 10,825,967 B2* | 11/2020 | Hayashi | ............... H01L 33/507 |
| 2007/0267643 A1 | 11/2007 | Harada et al. | |
| 2010/0033955 A1 | 2/2010 | Zhu et al. | |
| 2011/0090672 A1* | 4/2011 | Zhu | ..................... G02B 6/0021 362/97.1 |
| 2011/0149594 A1 | 6/2011 | Terajima et al. | |
| 2012/0026722 A1 | 2/2012 | Zhu et al. | |
| 2012/0293979 A1* | 11/2012 | Zhang | ............... G02F 1/133611 362/84 |
| 2015/0036317 A1 | 2/2015 | Yamamoto et al. | |
| 2015/0124484 A1* | 5/2015 | Gu | ....................... G02B 6/0016 362/613 |
| 2018/0239193 A1 | 8/2018 | Hayashi | |
| 2019/0018184 A1 | 1/2019 | Miyashita et al. | |
| 2019/0146142 A1* | 5/2019 | Kakkar | ................ G02B 6/0055 362/612 |
| 2020/0209462 A1* | 7/2020 | Kasai | ................... G02B 6/0045 |

FOREIGN PATENT DOCUMENTS

| | | |
|---|---|---|
| JP | 2010045029 A | 2/2010 |
| JP | 2011210674 A | 10/2011 |
| JP | 2015032373 A | 2/2015 |
| JP | 2016115703 A | 6/2016 |
| JP | 2018097974 A | 6/2018 |
| JP | 2018133304 A | 8/2018 |
| WO | 2012141094 A1 | 10/2012 |
| WO | 2017122794 A1 | 7/2017 |

\* cited by examiner

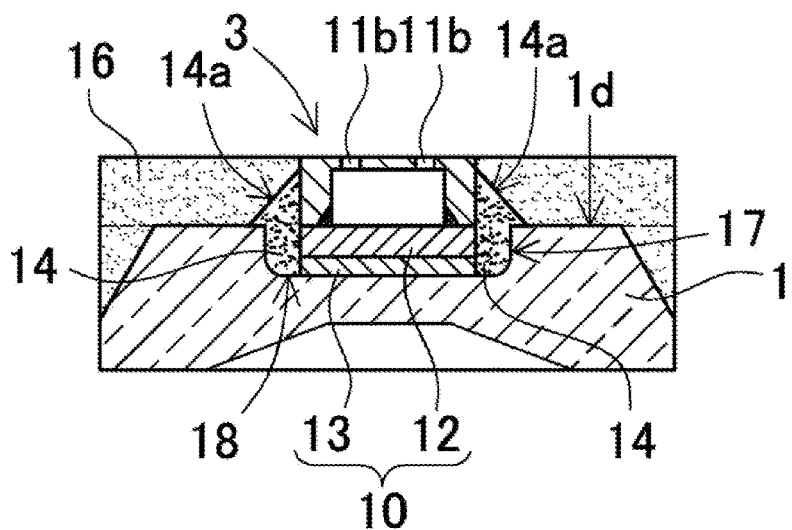
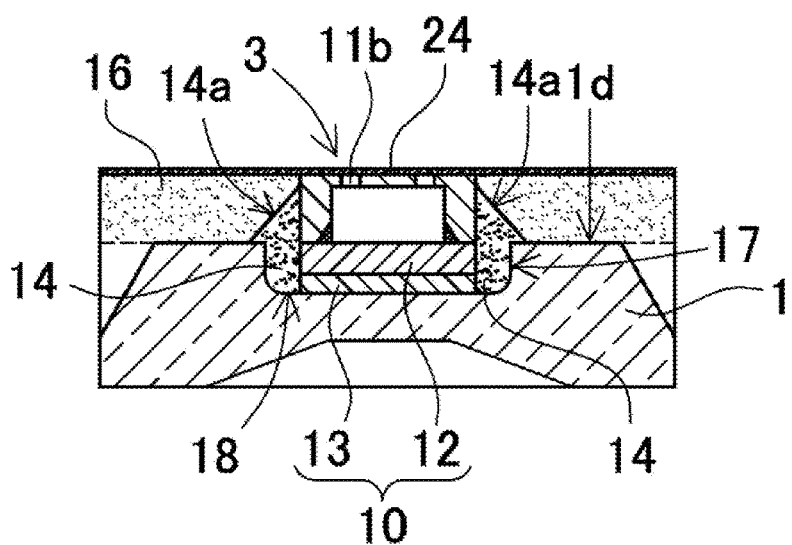
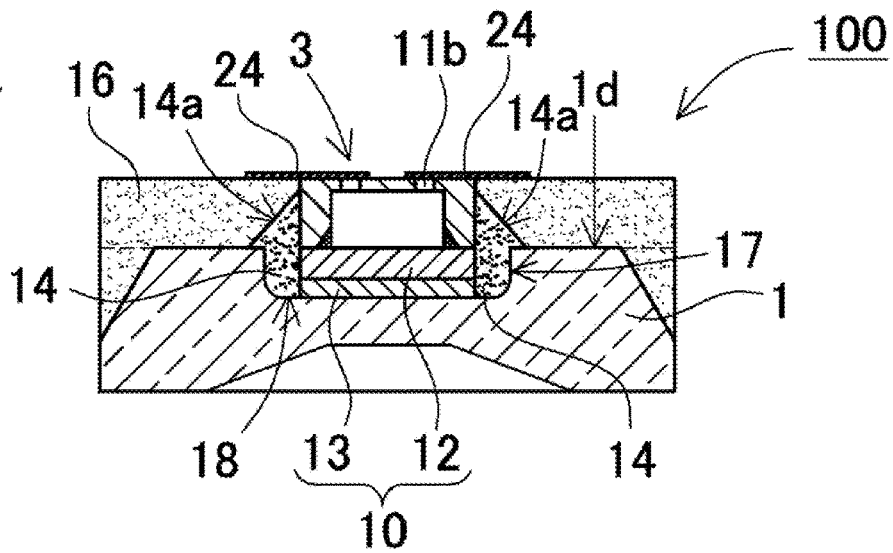

METHOD FOR MANUFACTURING LIGHT EMITTING MODULE WITH CONCAVE SURFACE LIGHT GUIDE PLATE

CROSS REFERENCE TO RELATED APPLICATIONS

This application claims the priority of JP patent applications No. JP 2018-185847 filed on Sep. 28, 2018 and No. JP 2018-191219 filed on Oct. 9, 2018 each entitled "METHOD FOR MANUFACTURING LIGHT EMITTING MODULE", each of which is incorporated herein by reference in its entirety for all purposes.

TECHNICAL FIELD

The present disclosure relates to a method for manufacturing a light emitting module.

BACKGROUND OF THE INVENTION

Light emitting devices using light emitting elements, such as light emitting diodes, are widely used as backlights for liquid crystal displays and various light sources for displays for example.

For example, a light source device disclosed in JP 2015-32373 A includes: a plurality of light emitting elements mounted on a mounting substrate; hemispherical lens members that respectively seal the plurality of light emitting elements; and a diffusion member disposed thereover and on which light from the light emitting elements is incident.

Furthermore, in a light emitting device disclosed in JP 2016-115703 A, a two-layer sheet composed of a sealing resin layer and a phosphor layer, which are integrated together, is fixed onto an upper surface of a light emitting element, and a reflective resin covers side surfaces of the two-layer sheet and the light emitting element.

PATENT DOCUMENTS (RELATED ART PATENT DOCUMENTS)

PATENT DOCUMENT 1: Japanese Unexamined Patent Application Publication No. 2015-32373 A
PATENT DOCUMENT 2: Japanese Unexamined Patent Application Publication No. 2016-115703 A

DISCLOSURE OF THE INVENTION

Problems to be Solved by the Invention

However, in the light source device disclosed in JP 2015-32373 A, a distance between the mounting substrate and the diffusion member needs to be larger than a thickness of the lens member, which may not achieve an adequate thinning of the light source device. The light emitting device disclosed in JP 2016-115703 A cannot evenly scatter and emit light from a plurality of light emitting elements. For this reason, such a light emitting device cannot be used in applications that require emission characteristics with less unevenness of luminance.

An object of the present disclosure is to provide a method for manufacturing a light emitting module that can achieve the emission characteristics with less unevenness of luminance.

Means for Solving the Problems

To achieve the above-mentioned object, a method for manufacturing a light emitting module according to the present disclosure includes steps of: preparing a light emitter and a light-transmissive light guide plate, the light emitter including a light emitting element, the light guide plate having a first main surface serving as a light emitting surface from which light is emitted outside and a second main surface located opposite to the first main surface and having a concave portion, the concave portion including a side surface and a bottom surface smaller than an opening of the concave portion in a cross-sectional view; fixing the light emitter to the bottom surface of the concave portion via a bonding member; and forming a wiring at an electrode of the light emitting element.

Effect of the Invention

According to the method for manufacturing the light emitting module of the present disclosure, a light emitting module with less unevenness of luminance can be obtained.

BRIEF DESCRIPTION OF THE DRAWINGS

FIGS. 14A, 14B, and 14C are enlarged schematic cross-sectional views showing examples of subsequent manufacturing steps of the light emitting module.

MODES FOR CARRYING OUT THE INVENTION

Figure 1:
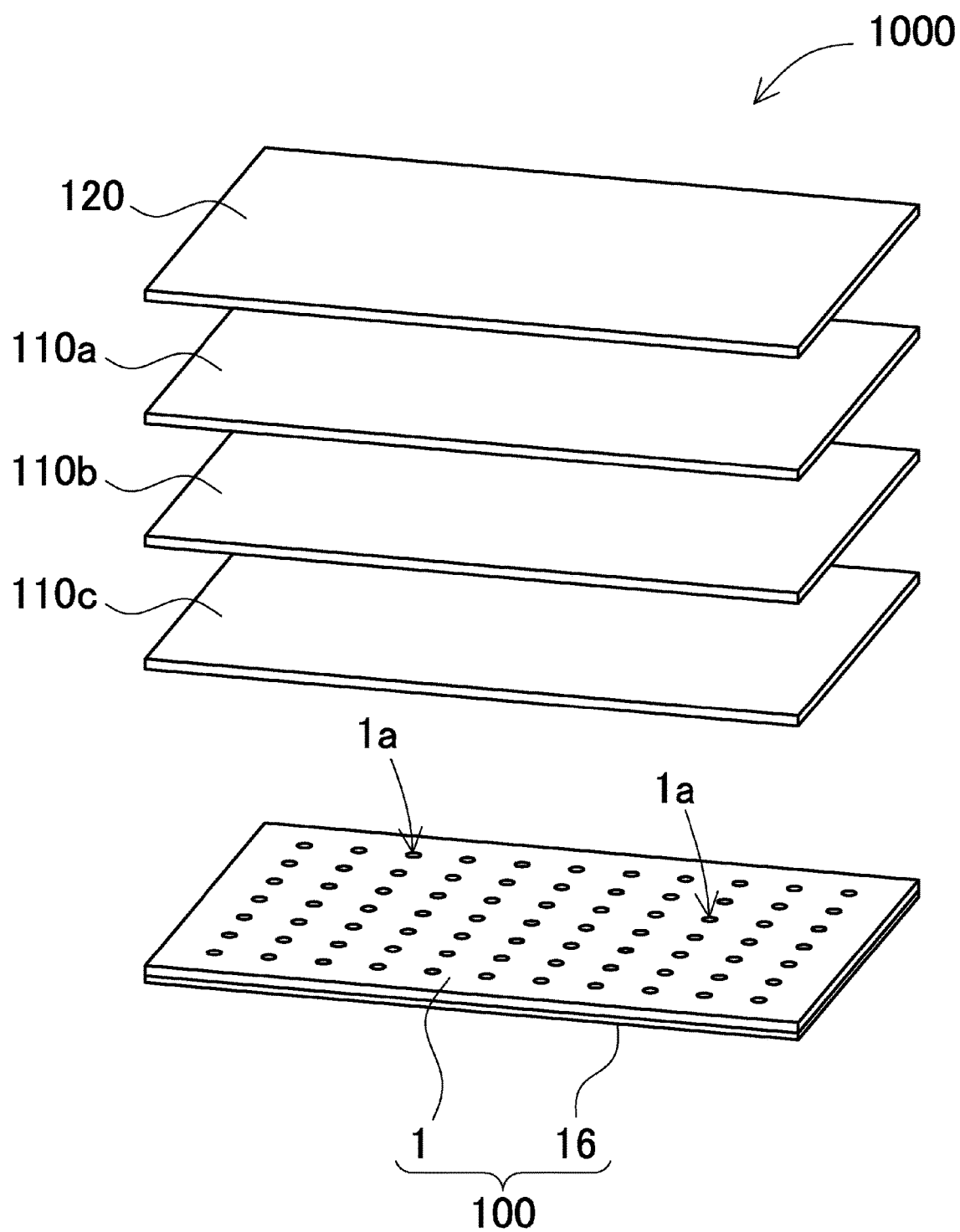
FIG. 1 is a configuration diagram showing each component of a liquid crystal display device according to an embodiment of the present disclosure.

The present disclosure will be described in detail below with reference to the accompanying drawings. In the description below, the terms (e.g., "upper", "lower", and other terms including these terms) indicative of specific directions or positions are used as needed. These terms are used for easy understanding of the present disclosure with reference to the drawings, and do not limit the technical scope of the present disclosure with their meanings. The same or equivalent parts or members are designated by the same reference numerals throughout the drawings.

The following embodiments merely illustrate a light emitting module for exemplifying the technical idea of the present disclosure, and thus the present disclosure is not limited thereto. Size, material, shape, relative arrangement, and the like of components mentioned below are not meant to limit the scope of the present disclosure only thereto, unless otherwise specified, and are intended to exemplify the present disclosure. Contents of the description regarding one embodiment or example can also be applied to other embodiments and examples. In addition, size, positional relationship, and the like of members shown in the drawings may be exaggerated to clarify the description thereof.

(Liquid Crystal Display Device 1000)

FIG. 1 is a configuration diagram showing each component of a liquid crystal display device 1000 that includes a light emitting module. The liquid crystal display device 1000 includes a liquid crystal panel 120, two lens sheets 110a and 110b, a diffusion sheet 110c, and a light emitting module 100 arranged in this order from the upper side thereof. The liquid crystal display device 1000 shown in FIG. 1 is a so-called direct-type liquid crystal display device in which the light emitting module 100 is laminated under the liquid crystal panel 120. The liquid crystal display device 1000 irradiates the liquid crystal panel 120 with light emitted from the light emitting module 100. The liquid crystal display device may include other members, such as a polarizing film and a color filter, in addition to the above-mentioned components.

(Light Emitting Module 100)

Figure 2:
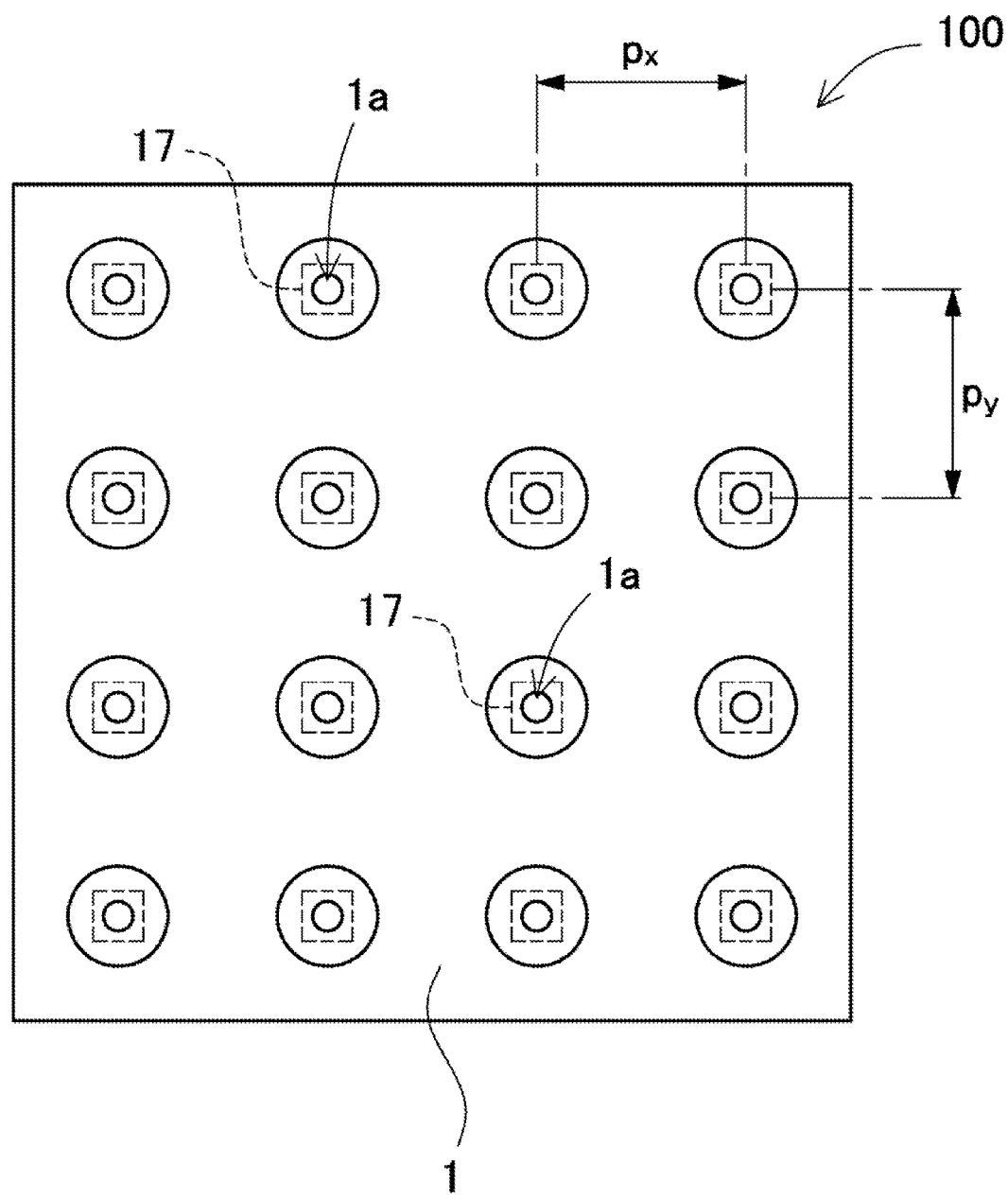
FIG. 2 is a schematic plan view of a light emitting module according to an embodiment of the present disclosure.
Figure 3:
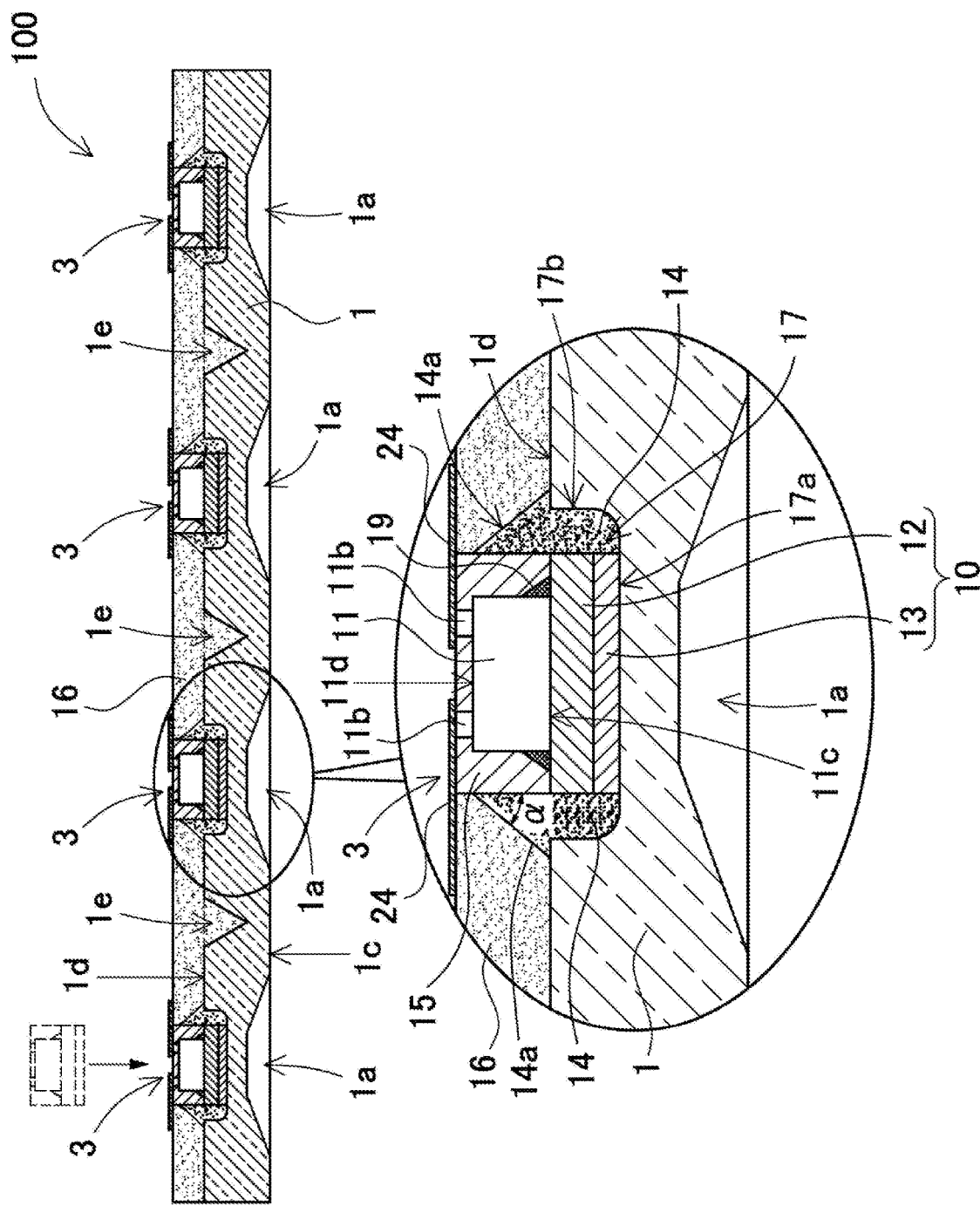
FIG. 3 is a partially enlarged schematic cross-sectional view of the light emitting module according to an embodiment of the present disclosure, which is turned upside down with a light guide plate facing downward in the embodiment.

FIGS. 2 and 3 show an example of the light emitting module 100 in the present embodiment. The light emitting module 100 of the present embodiment demonstrates white surface emission. FIG. 2 is a schematic plan view of the light emitting module according to the present embodiment. FIG. 3 is a partially enlarged schematic cross-sectional view showing the light emitting module according to the present embodiment. The light emitting module 100 shown in these figures includes light emitters 3, each including a light emitting element, and a light guide plate 1 that has a first main surface 1c serving as a light emitting surface from which light is emitted outside and a second main surface 1d having concave portions 17 in each of which the light emitter 3 is disposed. The concave portion 17 has side surfaces and a bottom surface smaller than an opening of the concave portion 17. The light emitter 3 is fixed to the bottom surface of the concave portion 17 via a bonding member. The bonding member is in contact with the side surface(s) of the concave portion 17 and outer side surface(s) of the light emitter 3.

Further, in the light emitting module 100, the light emitter 3 is provided with a first light reflective member 15 that embeds therein the light emitting element. The first light reflective member 15 has its outer peripheral surface arranged on the same plane as an outer peripheral surface of the light-transmissive member. Furthermore, a second light reflective member 16 is provided on the second main surface 1d of the light guide plate 1 to cover a part of the second main surface 1d of the light guide plate 1 and a part of the light emitter 3.

In the light emitting module 100 shown in FIGS. 2 and 3, one light guide plate 1 has a plurality of concave portions 17 therein, and the light emitter 3 is disposed in each of the concave portions 17. Alternatively, as shown in a schematic bottom view of FIG. 4, the light emitting module may be a light emitting module 100' that includes a plurality of light guide plates 1' arranged in a matrix, each light guide plate 1' having one concave portion 17, with the light emitter 3 disposed in the corresponding concave portion 17.

(Light Emitter 3)

The light emitter 3 includes a light emitting element 11 and a light-transmissive member 10 that covers a main light emitting surface 11c of the light emitting element 11. The first light reflective member 15 is provided to cover side surfaces of the light emitting element 11.

The light emitting element 11 has the main light emitting surface 11c, an electrode formation surface 11d located opposite to the main light emitting surface 11c, and the side surfaces located between the main light emitting surface 11c and the electrode formation surface 11d. A pair of electrodes 11b is formed on the electrode formation surface 11d.

The light emitting element 11 mainly emits light from the main light emitting surface 11c and irradiates the light-transmissive member 10 covering the main light emitting surface 11c with the light.

In the light emitter 3 of FIG. 3, the main light emitting surface 11c of the light emitting element 11 is covered with the light-transmissive member 10.

Furthermore, in the light emitter 3, the side surfaces of the light emitting element 11 are covered with the first light reflective member 15. The outer side surface of the first light reflective member 15 is arranged on the substantial same plane as the outer side surface of the light-transmissive member 10 in the light emitter 3 shown in this figure.

(Light Emitting Element 11)

The light emitting element 11 has the electrode formation surface 11d with a pair of positive and negative electrodes 11b formed thereon and the main light emitting surface 11c located opposite to the electrode formation surface 11d. In the light emitting module of the present embodiment, the light emitting element 11 may be flip-chipped thereon or mounted thereon using wires.

The light emitting element 11 include, for example, a light-transmissive substrate made of sapphire or the like, and a semiconductor multilayer structure laminated on the light-transmissive substrate. The semiconductor multilayer structure includes a light emitting layer, and a n-type semiconductor layer and a p-type semiconductor layer which sandwich the light emitting layer therebetween. The electrodes 11b, namely, a n-side electrode and a p-side electrode are electrically connected to the n-type semiconductor layer and the p-type semiconductor layer, respectively. In the light emitting element 11, for example, the main light emitting surface 11c included in the light-transmissive substrate is disposed to face the light guide plate 1, and the pair of electrodes 11b is provided on the electrode formation surface 11d located opposite to the main light emitting surface 11c.

The dimensions in the vertical, horizontal, and height directions of the light emitting element 11 are not particularly limited. However, the light emitting element 11 is preferably a semiconductor light emitting element that has the vertical and horizontal dimensions of 1000 μm or less, more preferably 500 μm or less, and still more preferably 200 μm or less, in the top plan view. The use of such a light emitting element can achieve a high-definition image when performing local dimming of the liquid crystal display device. In addition, since the light emitting element that has the vertical and horizontal dimensions of 500 μm or less can be prepared inexpensively, the resultant light emitting module 100 using this light emitting element can also be made inexpensive. It is noted that the light emitting element that has both the vertical and horizontal dimensions of 250 μm or less has an upper surface with a small area, and thus the amount of light emitted from the side surface of the light emitting element becomes relatively large. That is, this kind of light emitting element is more likely to emit light in a butt wing shape and thereby can be suitably used in the light emitting module of the present embodiment, in which the light emitting element is joined to the light guide plate with a distance between the light emitting element and the light guide plate set extremely short.

The light emitting element 11 may have any shape in the top plan view, for example, a square or a rectangle. The light emitting element which is used in the high-definition liquid crystal display device is preferably a rectangular light emitting element, whose upper surface preferably has long and short sides. In the case of the high-definition liquid crystal display device, the number of light emitting elements used therein is several thousands or more, and a mounting step of the light emitting elements becomes an important step. In the mounting step of the light emitting elements, even if some of the plurality of light emitting elements undergo a rotational displacement (for example, a displacement in the ±90 degree direction), the use of the light emitting element that is rectangular in the top plan view facilitates a visual confirmation of the light emitting elements. Furthermore, the p-type electrode and the n-type electrode can be formed while being appropriately spaced from each other, which can make it easier to form wirings to be mentioned later. On the other hand, when using square light emitting elements in the top plan view, small-sized light emitting elements can be mass-produced efficiently. The density (arrangement pitch) of the light emitting elements 11, i.e., a distance between the adjacent light emitting elements 11, can be set to, for example, approximately 0.05 mm to 20 mm, and preferably approximately 1 mm to 10 mm.

The light emitting element 11 may use well-known semiconductor light emitting elements. In the present embodiment, a light emitting diode flip-chipped is embodied as the light emitting element 11. The light emitting element 11 emits, for example, blue light. As the light emitting element 11, an element that emits light of any color other than blue can also be used. Alternatively, a plurality of light emitting elements 11 that emit light of different colors may be used. A color of the light emitted from the light emitting element 11 is adjusted to an emission color to the outside by a wavelength conversion member 12.

An element that emits light having an arbitrary wavelength can be selected as the light emitting element 11. For example, a light emitting element that contains a nitride-based semiconductor ($In_xAl_yGa_{1-x-y}N$, $0 \leq X$, $0 \leq Y$, $X+Y \leq 1$) or GaP can be used as the element that emits blue or green light. A light emitting element containing a semiconductor, such as GaAlAs or AlInGaP, can be used as the element that emits red light. Furthermore, a semiconductor light emitting element made of any material other than these materials can also be used. The emission wavelength of the light emitting element can be varied by changing the material of the semiconductor layers and a mixed crystal ratio thereof. The composition, emission color, size, the number and the like of the light emitting elements used can be selected as appropriate in accordance with the purpose.

(Light-Transmissive Member 10)

The light-transmissive member 10 covers the main light emitting surface 11c of the light emitting element 11 and transmits light emitted from the main light emitting surface 11c. The light-transmissive member 10 may contain a substance that excites the light emitted from the light emitting element 11 or may contain a substance that diffuses or/and reflects the light. The light-transmissive member 10 shown in FIG. 3 includes the wavelength conversion member 12 and a light diffusion portion 13 laminated on the wavelength conversion member 12. In the light-transmissive member 10 shown, the wavelength conversion member 12 is laminated on the light emitting element 11 side, while the light diffusion portion 13 is laminated on the light guide plate 1 side. The light-transmissive member 10 adjusts the wavelength of the light emitted from the light emitting element 11 by means of the wavelength conversion member 12, diffuses the light transmitted through the wavelength conversion member 12 by means of the light diffusion portion 13, and eventually irradiates the light guide plate 1 with the diffused light. Consequently, the light emitted from the light guide plate 1 can be made highly uniform.

In the light emitter 3 shown in FIG. 3, the light-transmissive member 10 including the wavelength conversion member 12 and the light diffusion portion 13 are joined to the light emitting element 11. In this way, the light-transmissive member 10 preferably includes the wavelength conversion member 12 and the light diffusion portion 13. The light-transmissive member 10 can also be formed by laminating a plurality of wavelength conversion members 12 and light diffusion portions 13. It is noted that the light-transmissive member 10 may be composed of only the wavelength conversion member, only the light diffusion portion, or only a resin that has adequate light transmittance without including any light-transmissive member or light diffusion portion.

(Wavelength Conversion Member 12)

The wavelength conversion member 12 is a member that receives the light emitted from the light emitting element 11 and converts the received light into light having a different wavelength. The wavelength conversion member 12 is formed by dispersing a wavelength conversion substance in a base material. The wavelength conversion member 12 may be formed of a plurality of layers. For example, the wavelength conversion member 12 may have a double layered structure that includes a first layer that contains the base material with the wavelength conversion substance added and a second layer as the light diffusion portion that contains the base material with a diffusion material added.

Examples of the base material suitable for use include an epoxy resin, a silicone resin, a resin made of a mixture of these resins, and a light-transmissive material, such as glass. From the viewpoint of light resistance and ease of molding of the wavelength conversion member, it is advantageous to select the silicone resin as the base material. As the base material of the wavelength conversion member 12, a material that has a higher refractive index than that of the material of the light guide plate 1 is preferable.

An example of the wavelength conversion substance contained in the wavelength conversion member 12 is a phosphor. Examples of the phosphor include a YAG phosphor, a β sialon phosphor, or fluoride-based phosphors, such as a KSF-based phosphor. The wavelength conversion member 12 may contain a single kind of wavelength conversion substance or a plurality of kinds of wavelength conversion substances. When the wavelength conversion member 12 contains a plurality of kinds of wavelength conversion substances, the wavelength conversion member 12 can contain, for example, a β-sialon phosphor that emits greenish light and a fluoride-based phosphor, such as a KSF-based phosphor, that emits reddish light. Thus, a color reproduction range of the light emitting module 100 can be widened. In this instance, the light emitting element 11 preferably includes a nitride-based semiconductor ($In_xAl_yGa_{1-x-y}N$, $0 \leq X$, $0 \leq Y$, $X+Y \leq 1$), which is capable of emitting light with a short wavelength that can efficiently excite the wavelength conversion member 12. For example, when intended to obtain reddish light as a battery module using the light emitting element 11 that emits bluish light, the wavelength conversion member 12 may contain 60% by weight or more and preferably 90% by weight or more of a KSF-based phosphor (red phosphor). That is, by containing a wavelength conversion substance that emits light of a specific color in the wavelength conversion member 12, the light emitter 3 may be controlled to emit light of the specific color. The wavelength conversion substance may be composed of quantum dots. The wavelength conversion substances may be located in the wavelength conversion member 12 in any way. For example, the wavelength conversion substances may be substantially evenly distributed or may be partially unevenly distributed. Alternatively, a plurality of layers, each containing wavelength conversion substances, may be laminated on each other.

(Light Diffusion Portion 13)

The light diffusion portion 13 diffuses and/or reflects the light emitted from the light emitting element 11, to thereby prevent a local concentration of the light on the main light emitting surface 11c and thus prevent unevenness of the luminance. In the light diffusion portion 13, a diffusing material is added to the base material. The light diffusion portion 13 may use the above-mentioned resin material as the base material, which contains white inorganic fine particles, such as $SiO_2$ and $TiO_2$. The diffusing material can also use a whitish resin or metal that is processed into fine particles and serves as a light reflective member. These diffusing materials are irregularly contained in the base material, so that the light passing through an inside of the light diffusion portion is reflected and diffused repeatedly and irregularly in multiple directions, which prevents the local concentration of the emitted light, thereby preventing the unevenness of the luminance.

It is noted that the light diffusion portion has a reflectance of 60% or more, and preferably 90% or more, with respect to the light emitted from the light emitting element 11.

In the light emitter 3 shown in FIG. 3, in the top plan view, an outer shape of the light-transmissive member 10 composed of the wavelength conversion member 12 and the light diffusion portion 13 is set larger than that of the light emitting element 11. The light emitter 3 transmits more light that emitted from the main light emitting surface 11c of the light emitting element 11, through the wavelength conversion member 12 and the light diffusion portion 13, causing the transmitted light to enter the light guide plate 1, thereby making it possible to reduce the unevenness of color and luminance.

(Light-Transmissive Adhesive Member 19)

As shown in FIG. 3, parts of the side surfaces of the light emitting element 11 and parts of the light-transmissive member 10 are covered with a light-transmissive adhesive member 19. An outer side surface of the light-transmissive adhesive member 19 is preferably an inclined surface that extends from the side surface of the light emitting element 11 toward the light-transmissive member 10, and more preferably a curved surface that is convex toward the light emitting element 11. Thus, the light-transmissive adhesive member 19 can guide more light, emitted from the side surfaces of the light emitting element 11, to the light-transmissive member 10, thereby enhancing a light extraction efficiency.

The light-transmissive adhesive member 19 may be disposed between the main light emitting surface 11c of the light emitting element 11 and the light-transmissive member 10. Thus, for example, the light-transmissive adhesive member 19 contains a diffusing agent or the like, whereby the light emitted from the main light emitting surface 11c of the light emitting element 11 can be diffused by the light-transmissive adhesive member 19 to enter the light-transmissive member 10, thus reducing the unevenness of luminance.

The light-transmissive adhesive member 19 may use the same material as a bonding member 14 to be mentioned later.

(First Light Reflective Member 15)

Further, in the light emitter 3, the side surfaces of the light emitting element 11 are covered with the first light reflective member 15 while the light-transmissive member 10 is provided at the light emitting element 11. More specifically, the first light reflective member 15 covers parts of the side surfaces of the light emitting element 11, which are not covered with the light-transmissive adhesive member 19, and the outer side surfaces of the light-transmissive adhesive member 19.

The first light reflective member 15 may be made of a material with excellent light reflectivity, and preferably a white resin that is a transparent resin to which white powder or the like is added as an additive for reflecting light. The first light reflective member 15 covers the other surfaces of the light emitting element 11, except for the main light emitting surface 11c, thereby preventing leakage of the light in directions other than a direction toward the main light emitting surface 11c. That is, the first light reflective member 15 reflects the light emitted from the side surfaces and electrode formation surface 11d of the light emitting element 11 to effectively emit the light of the light emitting element 11 from the first main surface 1c of the light guide plate 1 to the outside. Consequently, a light extraction efficiency of the light emitting module 100 can be enhanced.

The first light reflective member 15 is suitably formed of a white resin that has a reflectance of 60% or more, and preferably 90% or more, with respect to the light emitted from the light emitting element 11. The first light reflective member 15 is preferably made of a resin that contains a white pigment, such as white powder. In particular, a silicone resin containing inorganic white powder, such as titanium oxide, is preferable.

The first light reflective member 15 is in contact with at least a part of the side surface of the light emitting element 11 and is located around the light emitting element 11 to embed therein the light emitting element 11 so that the electrodes 11b of the light emitting element 11 are exposed at the surface of the first light reflective member 15. The first light reflective member 15 is in contact with the light-transmissive member 10, so that the outer side surface of the first light reflective member 15 is arranged on the same plane as the outer side surface of the light-transmissive member 10. The light emitter 3 including an integrated joint structure of the light emitting element 11 and the light-transmissive member 10 with the first light reflective member 15 is positioned onto the light guide plate 1.

(Light Guide Plate 1)

The light guide plate 1 is a light-transmissive member that scatters the light incident from the light source across a surface of the light guide plate 1 and emits the scattered light toward the outside. As shown in FIG. 3, the light guide plate 1 has the first main surface 1c serving as a light emitting surface, and the second main surface 1d located opposite to the first main surface 1c. A plurality of concave portions 17 are provided in the second main surface 1d of the light guide plate 1. In the present embodiment, a groove 1e is provided between adjacent concave portions 17.

A part of the light emitter 3 is disposed in the concave portion 17. More specifically, a part of the light emitter 3 is disposed in the concave portion 17 of the light guide plate 1 such that the light-transmissive member 10 faces the bottom surface of the concave portion 17. Thus, an entire light emitting module can be thinned. As shown in FIGS. 2 and 3, the light emitting module 100 can be formed by providing the plurality of concave portions 17 in the light guide plate 1 and disposing the part of the light emitter 3 in each of the concave portions 17.

Figure 4:
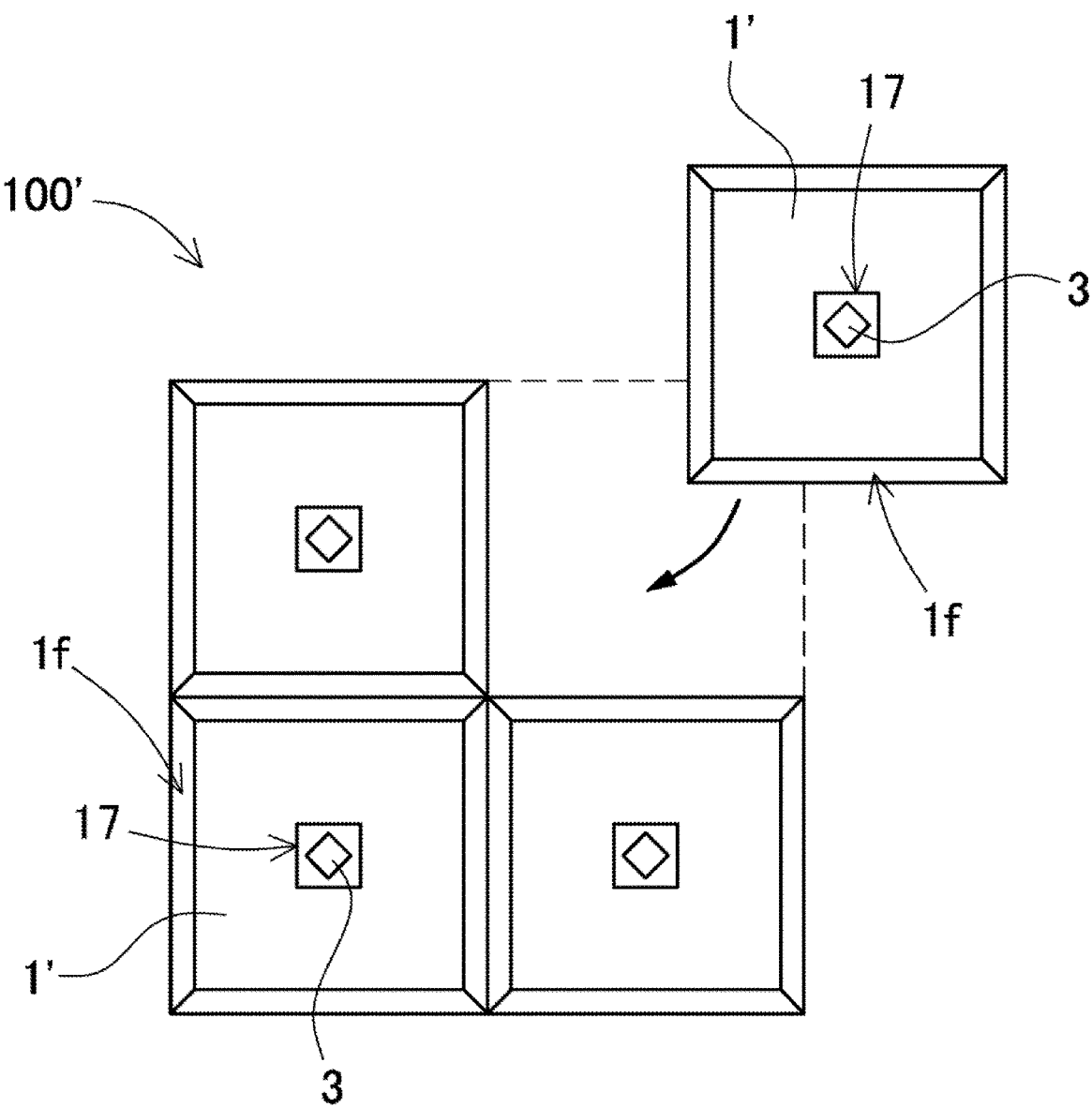
FIG. 4 is a schematic bottom view of a light emitting module according to another embodiment of the present disclosure.

Alternatively, as shown in FIG. 4, a light emitting module 100' can be formed by disposing a part of one light emitter 3 on a light guide plate 1' having one concave portion 17, and arranging a plurality of light guide plates 1' on a plane. As shown in FIG. 3, the light guide plate 1 having a plurality of concave portions 17 has a lattice-shaped groove 1e between the concave portions 17. As shown in FIG. 4, the light guide plate 1' with one concave portion 17 has an inclined surface 1f on an outer peripheral portion of the second main surface 1d toward its outer peripheral edge.

The second light reflective member 16 is provided on a surface of each of the grooves 1e and the inclined surfaces 1f. The second light reflective member 16 in the groove 1e is preferably formed of a white resin that reflects the light from the light emitter 3, which will be mentioned later in detail. This prevents the light emitted from the light emitting element 11 from entering an adjacent light guide plate 1' partitioned by the groove 1e, which can prevent the light emitted from each light emitting element 11 from leaking to the adjacent light guide plate 1'. The second light reflective member 16 is joined to the inclined surface 1f at the outer peripheral portion of the second main surface 1d of one light guide plate 1'. Thus, the second light reflective member 16 prevents the leakage of the light to a surrounding of the light guide plate 1', which prevents a reduction in a luminous intensity of the light from the first main surface 1c of the light guide plate 1'.

A size of the light guide plate 1 is set depending on that of the liquid crystal display device 1000 as appropriate. For example, the light guide plate 1 with the plurality of concave portions 17 can have one side of approximately 1 cm to 200 cm, and preferably approximately 3 cm to 30 cm. A thickness of the light guide plate 1 can be approximately 0.1 mm to 5 mm, and is preferably approximately 0.1 mm to 3 mm. A planar shape of the light guide plate 1 can be, for example, a substantially rectangular shape, a substantially circular shape, or the like.

Examples of material usable for the light guide plate 1 include resin materials, such as thermoplastic resins and thermosetting resins, and optically transparent materials such as glass. Examples of the thermoplastic resins include acrylic resins, polycarbonates, cyclic polyolefins, polyethylene terephthalate, polyesters, and the like, whereas examples of the thermosetting resins include epoxy resins, silicone resins, and the like. In particular, a thermoplastic resin material is preferable since this material enables an efficient manufacture of the light guide plate 1 in an injection molding. Among them, polycarbonates which are inexpensive and have high transparency are preferable. In a light emitting module to be manufactured without being exposed to a high temperature environment such as a reflow soldering in a manufacturing step, a thermoplastic material with a low heat resistance such as a polycarbonate can be used.

The light guide plate 1 may be formed of a single layer or alternatively may be formed by laminating a plurality of light-transmissive layers. When the plurality of light-transmissive layers are laminated, a layer with a different refractive index, for example, an air layer, is preferably provided between arbitrary adjacent light-transmissive layers. Consequently, the light is more likely to be diffused, which makes it possible to produce a light emitting module with a less unevenness of the luminance. Such a configuration can be realized, for example, by providing a spacer(s) between arbitrary plural light-transmissive layers to separate these light-transmissive layers and then forming an air layer therebetween. Alternatively, a light-transmissive layer may be provided on the first main surface 1c of the light guide plate 1, and a layer having a different refractive index, for example, an air layer, may be provided between the first main surface 1c of the light guide plate 1 and the above-mentioned light-transmissive layer. Thus, the light is more likely to be diffused, which makes it possible to produce a liquid crystal display device with a less unevenness of the luminance. Such a configuration can be realized, for example, by providing a spacer between an arbitrary light guide plate 1 and the light-transmissive layer to separate them from each other and then forming an air layer therebetween.

(Concave Portion 17)

The concave portions 17 are provided in the second main surface 1d of the light guide plate 1. A part of the light emitter 3 is placed in the concave portion 17 of the light guide plate 1 so that the light-transmissive member 10 faces the bottom surface of the concave portion 17.

The concave portion 17 has a bottom surface smaller than an opening thereof in the top plan view. Thus, any void between the concave portion 17 and the bonding member 14 can be easily eliminated in a step of filling the bonding member, i.e., material of the bonding member into the concave portion 17 of the light guide plate. Consequently, the light emitting module with no void can be obtained. A size of the bottom surface of the concave portion 17 is larger than that of the light emitter 3 in the top plan view. As shown in FIG. 3, the side surface of the concave portion 17 is located outside the outer side surface of the light emitter 3.

In the light guide plates 1 and 1' shown in FIGS. 2 to 4, an inner shape of each of the bottom surface and the opening of the concave portion 17 is set as a quadrilateral that has rounded corners in the top plan view, and an outer shape of the light emitter 3 disposed in the concave portion 17 is also set as a quadrilateral. The quadrilateral light emitter 3 may be disposed in the quadrilateral concave portion 17 such that each side surface of the light emitter 3 is parallel to an opposing side surface of the concave portion 17. As shown in FIG. 4, each outer side surface of the light emitter 3 is more preferably disposed in such a manner as to be rotated by 45° with respect to each side surface of the concave portion 17. The light emitter 3 is preferably disposed such that a center of the light emitter 3 substantially coincides with that of the bottom surface of the concave portion 17 in the top plan view. This can make a distance between the side surface of the light emitter 3 and the side surface of the concave portion 17 constant, which can improve an unevenness of color in the light emitting module. It is noted that the light emitter having the quadrilateral outer shape can also be disposed such that each side of the light emitter intersects each side of the quadrilateral concave portion, in other words, such that the light emitter is rotated with respect to the quadrilateral concave portion.

The side surface of the concave portion 17 shown in FIGS. 2 to 4 includes a curved surface that is convex toward an outside of the concave portion. The curved surface is provided at the bottom surface side of the concave portion and is continuous to the bottom surface of the concave portion. The side surface of the concave portion 17 may include a surface that is vertical to the bottom surface and that is located at the opening side of the concave portion.

The size of the bottom surface of the concave portion 17 in the top plan view may vary depending on the outer shape of the light emitter 3. However, the bottom surface of the concave portion 17 can be set to, for example, 0.05 mm to 10 mm and is preferably 0.1 mm to 2 mm in a diameter for a circular shape, in a long diameter for an elliptical shape, or in a length of a diagonal line for a quadrilateral. A depth of the concave portion 17 can be set to 0.05 mm to 4 mm, and is preferably set to 0.1 mm to 1 mm. A shape of the bottom surface of the concave portion 17 in the top plan view can be, for example, substantially rectangular or substantially circular and can be selected depending on an arrangement pitch between adjacent concave portions 17 or the like. When the arrangement pitch between the concave portions 17 (i.e., a distance between centers of two closest concave portions 17) is substantially equal, the shape of the concave portion 17 is preferably substantially circular or substantially square in the top plan view.

As shown in FIG. 3, a height of the concave portion 17 from the bottom surface of the concave portion 17 to the second main surface 1*d* is more preferably set such that the main light emitting surface 11*c* of the light emitting element 11 is arranged on the same plane as the second main surface 1*d* in the cross-sectional view.

(Modification of Concave Portion 17)

Figure 5:
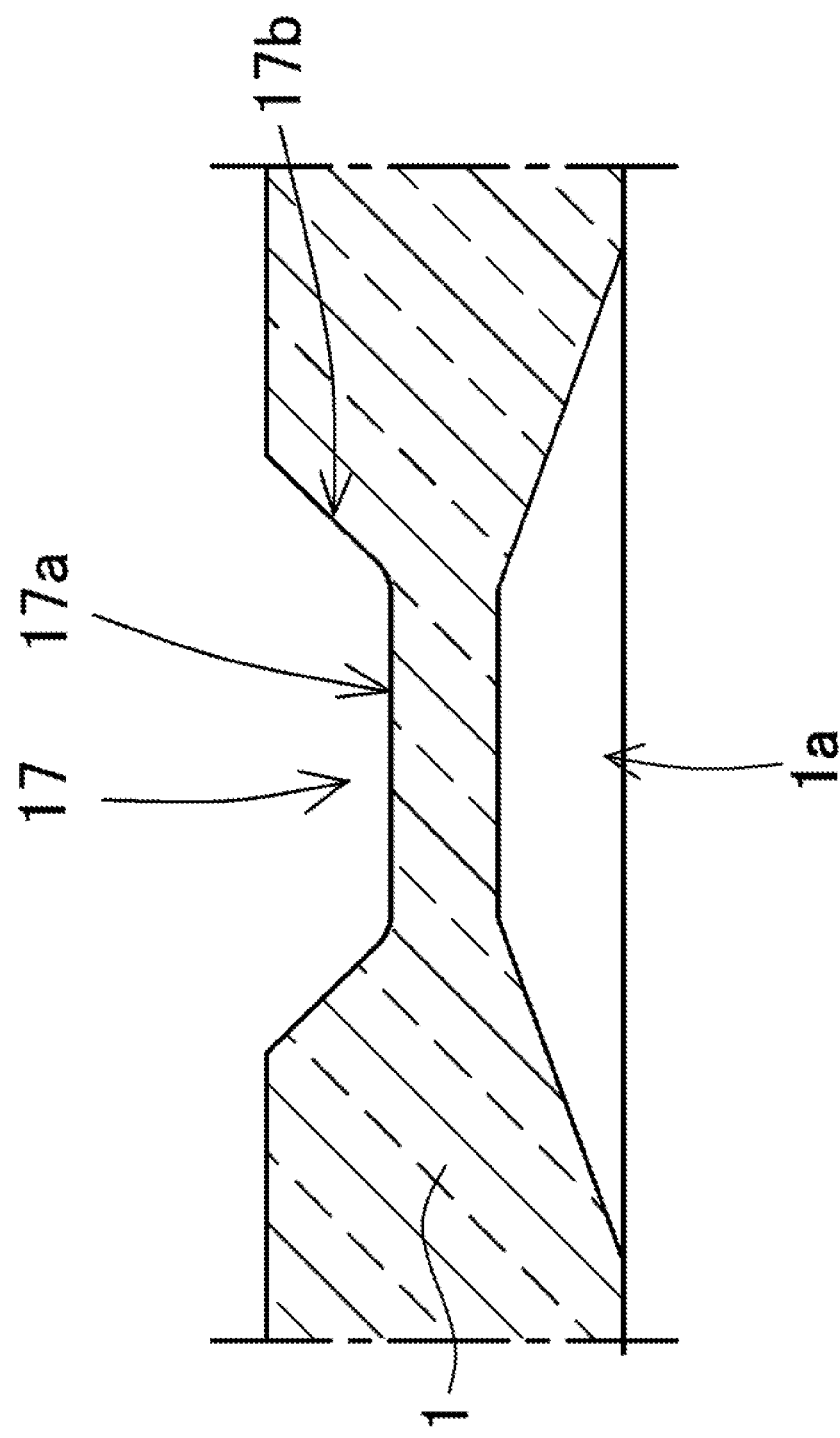
FIG. 5 is a schematic cross-sectional view showing a modification of a concave portion.

Furthermore, the side surface of the concave portion 17 may include a plane inclined from the bottom surface of the concave portion 17 toward the opening thereof. The concave portion 17 shown in FIG. 5 differs from the concave portion 17 shown in FIGS. 2 to 4 in that the side surface on the opening side of the concave portion is a plane that is inclined from the bottom surface of the concave portion toward the opening thereof. In such a concave portion 17, any void between the concave portion 17 and the bonding member 14 are easily eliminated in the step of filling the bonding member, specifically, the material of the bonding member into the concave portion of the light guide plate as mentioned later.

Figure 6:
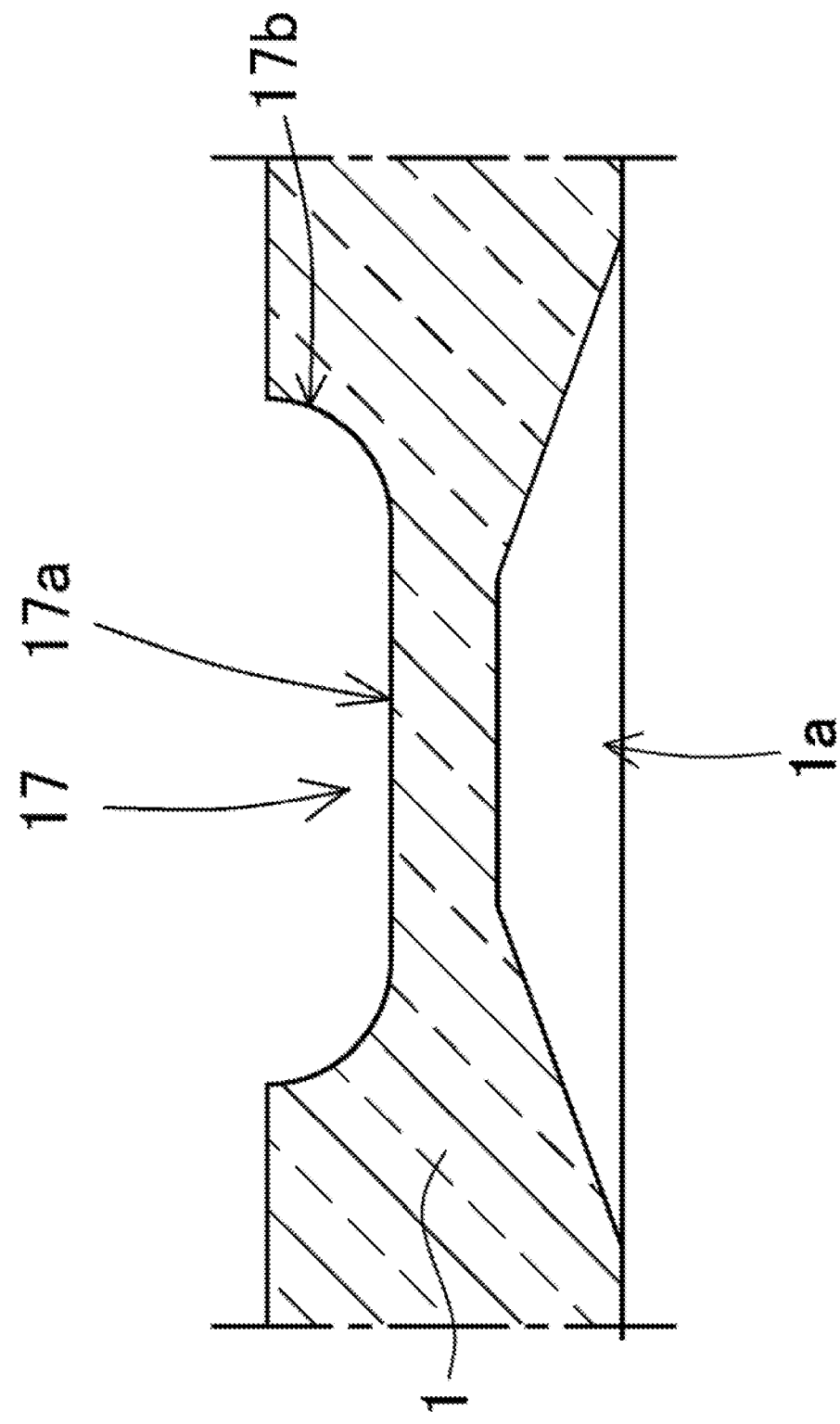
FIG. 6 is a schematic cross-sectional view showing another modification of the concave portion.
Figure 7:
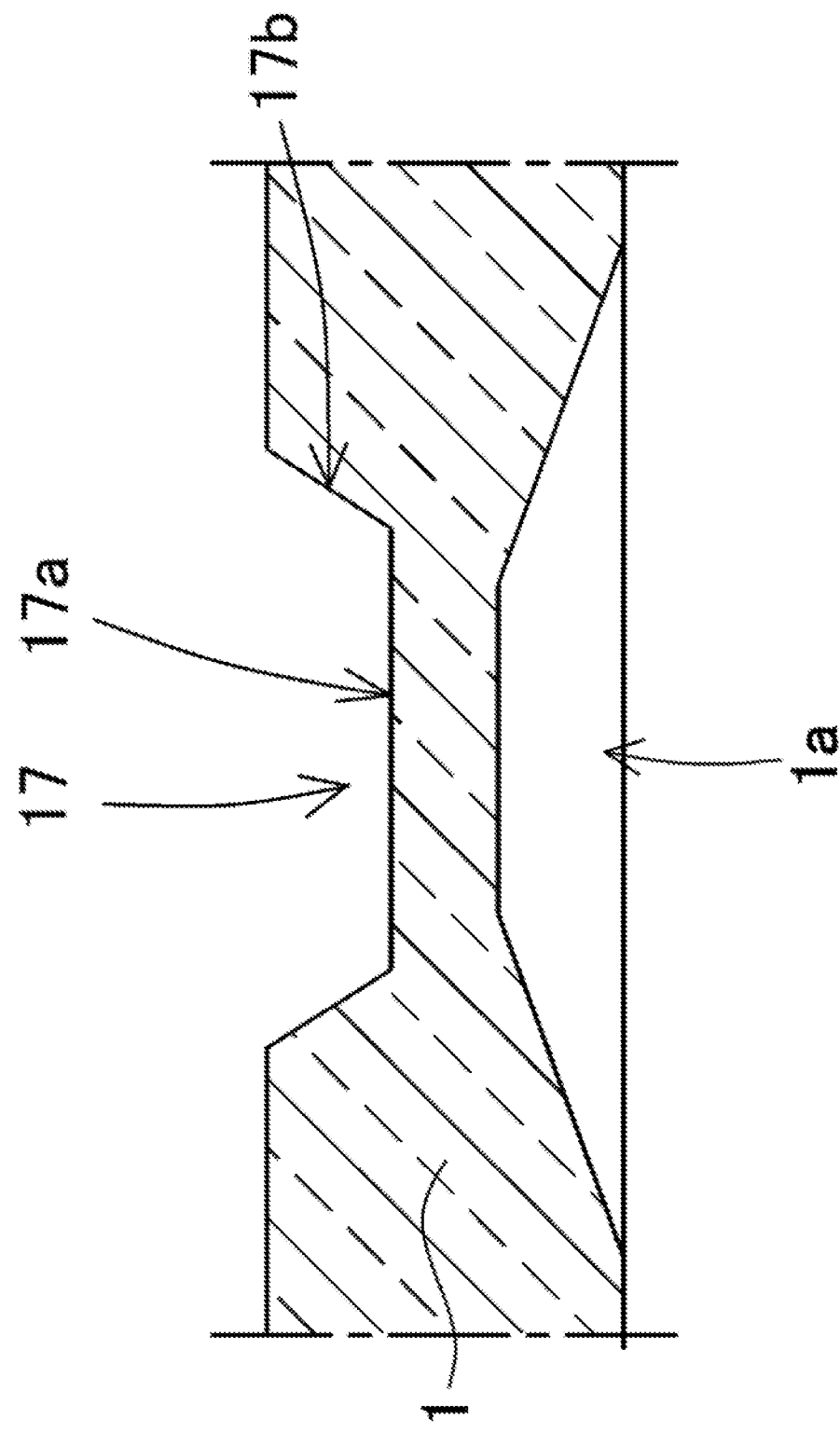
FIG. 7 is a schematic cross-sectional view showing another modification of the concave portion.

As shown in FIG. 6, the concave portion 17 may be formed such that its side surface is constituted of only a curved surface that is convex toward the outside of the concave portion. Alternatively, as shown in FIG. 7, the concave portion 17 may be formed such that its side surface is constituted of only a plane that is inclined from the bottom surface of the concave portion toward the opening thereof. Also in such a concave portion 17, any void formed between the concave portion 17 and the bonding member 14 is easily eliminated in the step of filling the bonding member into the concave portion of the light guide plate to be mentioned later.

(Bonding Member 14)

The light-transmissive bonding member 14 is in contact with the inner side surfaces of the concave portion 17 and the outer side surfaces of the light emitter 3. The bonding member 14 is disposed to be in contact with a part of the first light reflective member 15 positioned outside the concave portion 17, in other words, to cover a region that lies from the outer side surface of the light-transmissive member 10 to the outer side surface of the first light reflective member 15. The outer side surface of the bonding member 14 is an inclined surface 14*a*. The inclined surface 14*a* is formed such that an inclination angle α between the outer side surface of the first light reflective member 15 and the inclined surface 14*a* is an acute angle.

The bonding member 14 may be disposed between the light-transmissive member 10 and the bottom surface of the concave portion 17.

As shown in FIG. 3, the bonding member 14 is in contact with the second main surface 1*d* of the light guide plate 1. Thus, a region where the inclined surface 14*a* is formed is widened, and thus more light can be reflected, which can achieve the less unevenness of luminance. The inclination angle α between the inclined surface 14*a* of the bonding member 14 and the outer side surface of the first light reflective member 15 may be 5° to 50°, and preferably 10° to 45°.

As shown in FIG. 3, the bonding member 14 has the inclined surface 14*a* in the cross-sectional view. This shape allows the light incident on the inclined surface 14*a* through the bonding member 14 to evenly reflect toward the light emitting surface side.

As the bonding member 14, a light-transmissive, thermosetting resin material, such as an epoxy resin and a silicone resin, can be used. The bonding member 14 has a light transmittance of 60% or more, and preferably 90% or more. Further, the bonding member 14 may contain a diffusion material or the like, may contain a white powder or the like which is an additive reflecting light, or may be composed of only a light-transmissive resin material that does not contain the diffusion material, the white powder, or the like.

(Modification of Inclined Surface 14*a*)

Figure 8:
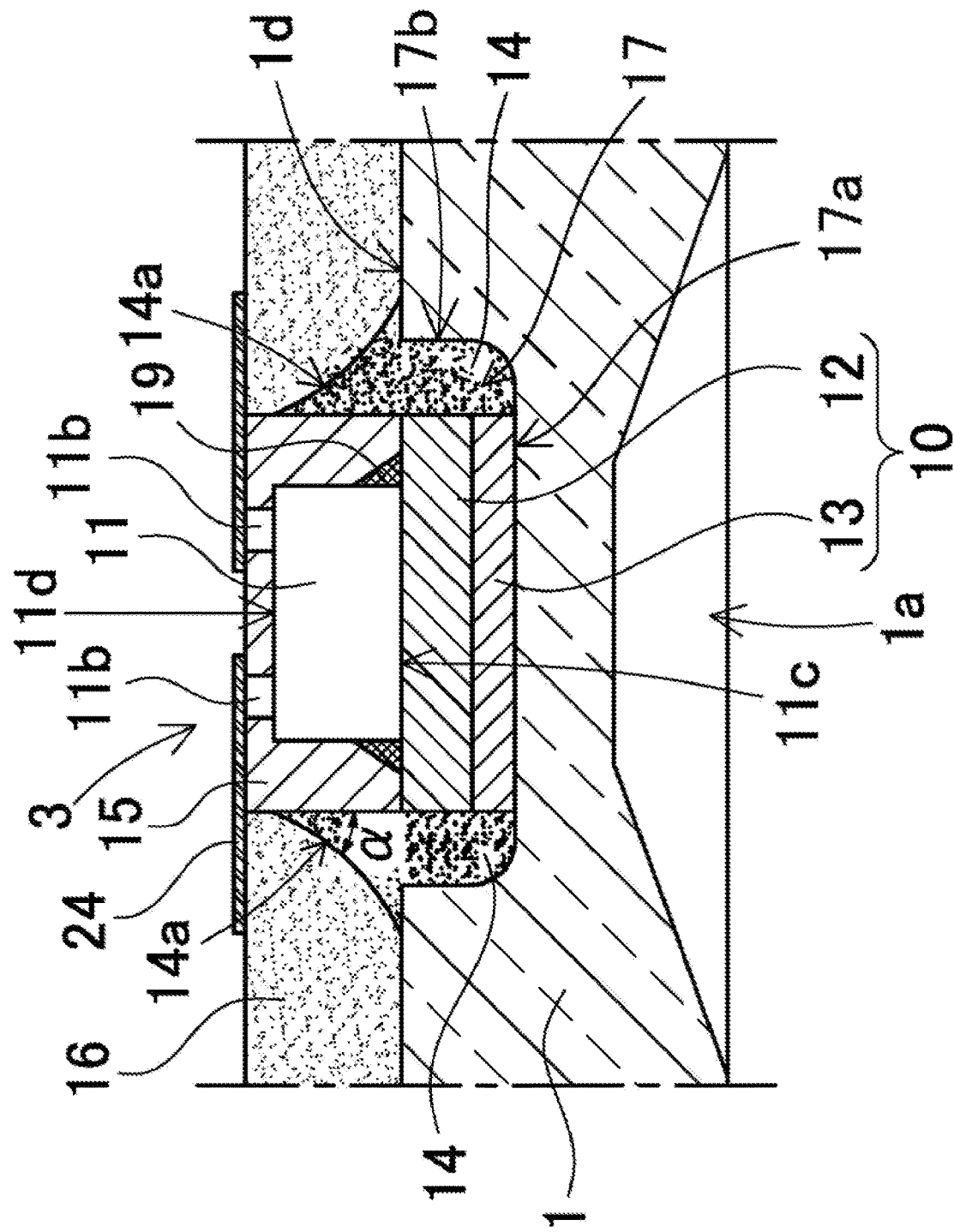
FIG. 8 is an enlarged schematic cross-sectional view of a light emitting module according to another embodiment of the present disclosure.

The inclined surface 14*a* of the light-transmissive bonding member 14 can also be a curved surface in the cross-sectional view. The inclined surface 14*a* of the bonding member 14 shown in FIG. 8 is a curved surface that is convex toward the concave portion 17 side. The inclined surface 14*a* may widen a region where the reflected light on the inclined surface 14*a* travels, thereby achieving the less unevenness of luminance.

Figure 9:
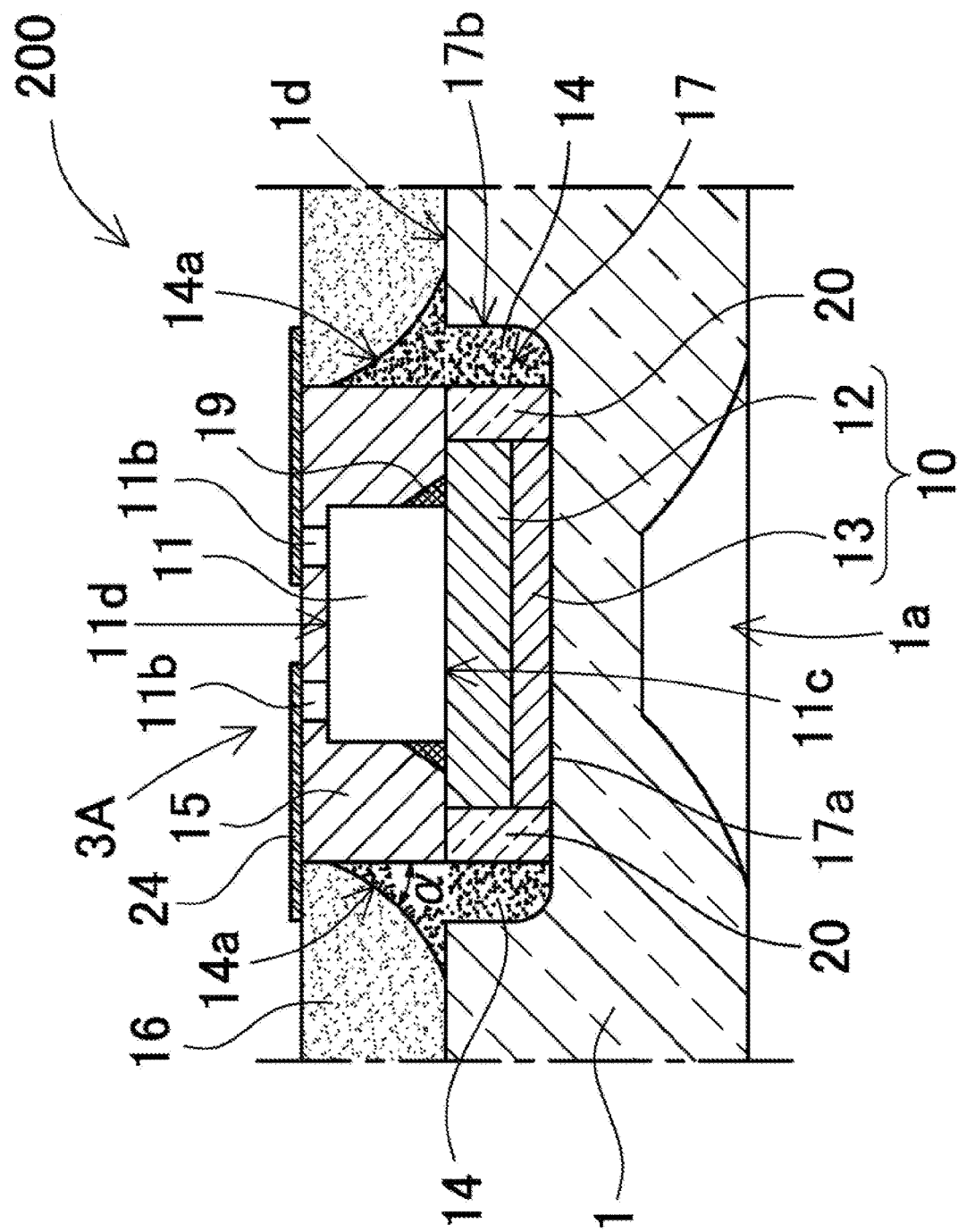
FIG. 9 is an enlarged schematic cross-sectional view of a light emitting module according to another embodiment of the present disclosure.

In the bonding member 14 shown in FIG. 9, the inclined surface 14*a* covers an outer part of the second main surface 1*d* of the light guide plate 1, compared to the embodiment shown in FIG. 8. More specifically, the bonding member 14 preferably covers the second main surface 1*d* more in the cross-sectional view. However, when one light guide plate 1 has a plurality of light emitters 3, it is preferable that the bonding member 14 is not in contact with the bonding member 14 that covers the adjacent light emitter 3.

Consequently, a total area of the inclined surfaces 14*a* may be increased to thereby reflect more light. Also in the bonding member 14 shown in this figure, the inclined surface 14*a* is formed to be the curved surface that is convex toward the concave portion 17 side in the cross-sectional view, and thus the reflected light can be diffused across the wide region, thereby achieving the less unevenness of luminance.

A light emitting module 200 shown in FIG. 9 further includes a light-transmissive resin portion 20 on the outer side surface of the light-transmissive member 10 of a light emitter 3A. The light-transmissive resin portion 20 can protect the outer side surfaces of the wavelength conversion member 12 and the light diffusion portion 13 in a step of a singulation into the light emitting units 3 as mentioned later. The light-transmissive resin portion 20 may use, for example, a light-transmissive resin that has a light transmittance of 60% or more, and preferably 90% or more. In the light emitter 3A, the first light reflective member 15 is provided to be in contact with the light-transmissive member 10 and the light-transmissive resin portion 20.

(Optically Functional Portion 1*a*)

The light guide plate 1 can be provided with an optically functional portion 1*a* having a function of reflecting or diffusing the light from the light emitter 3, on the first main surface 1*c* side. The light guide plate 1 can spread the light from the light emitter 3 laterally, i.e., toward the side of the light emitter 3 to average a luminous intensity in a plane of the light guide plate 1. The optically functional portion 1*a* can have, for example, a function of spreading the light in the plane of the light guide plate 1. The optically functional portion 1*a* is constituted of, for example, a concave part of a polygonal pyramid shape, such as a cone, a quadrangular pyramid, or a hexagonal pyramid, provided on the first main surface 1*c* side; or a concave part of a truncated cone shape (see FIG. 3), a truncated polygonal pyramid shape; or a concave part of a truncated cone shape with its side surface is formed by a curved surface that is convex inward (see FIG. 9). Thus, the light applied to the light guide plate 1 and an interface between the inclined surface of the concave part of the optically functional portion 1*a* and a material (for example, air) with a different refractive index in the optically functional portion 1*a* can be reflected in the direction toward the side of the light emitter 3. For example, the optically functional portion 1*a* may be formed by providing a light reflective material or the like (for example, a reflective film made of metal, a white resin, or the like) in the concave part with the inclined surface. The inclined surface of the optically functional portion 1*a* may be a plane or a curved surface in the cross-sectional view. A depth of the concave part, which is the optically functional portion 1*a*, is determined in consideration of the depth of the above-mentioned concave portion 17. That is, the depths of the optically functional portion 1*a* and the concave portion 17 can be appropriately set as long as they are separated from each other.

As will be mentioned later, the optically functional portion 1*a* is preferably provided at a position corresponding to each of the light emitters 3, that is, at a position opposite to the light emitter 3 disposed on the second main surface 1*d* side. In particular, an optical axis of the light emitter 3 preferably coincides substantially with a central axis of the optically functional portion 1*a*. Therefore, the optically functional portion 1*a* formed on the first main surface 1*c* is provided so that its center coincides with the center of the bottom surface of the concave portion 17 formed on the second main surface 1*d*. Thus, by positioning the light emitter 3 at the center of the concave portion 17, the optical axis of the light emitter 3 can easily coincide with the central axis of the optically functional portion 1*a*. The size of the optically functional portion 1*a* can be set as appropriate.

The plurality of concave portions 17 and optically functional portions 1*a* are provided in the light guide plate 1, and the light emitter 3 is disposed in each concave portion 17, so that both the light emitter 3 and the optically functional portion 1*a* can be disposed with a high positional accuracy. Thus, the light from the light emitting element 11 can be made uniform, which produces a high-quality light source for backlighting with less unevenness of the luminance and color. In the light guide plate 1 that includes the optically functional portion 1*a* on the surface opposite to the concave portion 17 with the light emitters 3 disposed therein, the optically functional portion 1*a* is provided at the position corresponding to the concave portion 17 in which the light emitter 3 is disposed. Thus, the light emitting element 11 and the optically functional portion 1*a* can be more easily positioned, thereby suppressing the misalignment therebetween.

In the light emitting module 100 in which the plurality of light emitters 3 are disposed at the light guide plate 1 with the plurality of concave portions 17, the light emitters 3 are arranged two-dimensionally on the plane of the light guide plate 1 in a planar view thereof. Preferably, as shown in FIG. 2, the plurality of light emitters 3 are disposed in respective concave portions 17 that are two-dimensionally arranged on the plane in two orthogonal directions, namely, the x direction and the y direction. As shown in the example of FIG. 2, an arrangement pitch $p_x$ in the x direction between the adjacent concave portions 17 with the light emitters 3 therein and an arrangement pitch $p_y$ in the y direction therebetween may be the same or different from each other. These two arrangement directions are not necessarily orthogonal to each other. The arrangement pitch in the x direction or the y direction is not limited to an equal interval and may be an unequal interval. For example, the concave portions 17 in each of which the light emitter 3 is disposed may be arranged to make an interval therebetween wider from the center of the light guide plate 1 toward its periphery. The term "pitch between the light emitters 3 disposed in the respective concave portions 17" as used herein refers to a distance between the optical axes, i.e., the centers, of the adjacent light emitters 3.

(Second Light Reflective Member 16)

As shown in FIG. 3, the second light reflective member 16 covers the second main surface 1*d* of the light guide plate 1 and the light emitters 3. More specifically, the second light reflective member 16 covers a region not covered by the bonding member 14 and located on the second main surface 1*d* of the light guide plate 1, the inclined surface 14*a* of the light-transmissive bonding member 14, and a part of the outer surface of the first light reflective member 15.

A second light reflective member 16 reflects the light that has been emitted from the light emitting element 11 and entered the light guide plate 1, and guides the light toward the side of the first main surface 1*c* serving as the light emitting surface for allowing the light to emit to the outside, thereby making it possible to improve the light extraction efficiency. The second light reflective member 16 may be laminated on the light guide plate 1, thereby reinforcing the light guide plate 1. Therefore, the second light reflective member 16 may serve as both a member that protects the light emitting elements 11 and a reflective layer that reflects the light from the second main surface 1d of the light guide plate 1, so that the thinning of the light emitting module 100 can be achieved.

The material which is the same as that of the above-mentioned first light reflective member 15, that is, a white resin that contains a transparent resin with white powder or the like added thereto as an additive for reflecting the light may be suitably used in the second light reflective member 16. The second light reflective member 16 efficiently radiates the light, which has been emitted from the light emitting element 11, from the first main surface 1c of the light guide plate 1 to the outside.

Similarly to the first light reflective member 15, the second light reflective member 16 may be formed using a white resin that has a reflectance of 60% or more, and preferably 90% or more, with respect to the light emitted from the light emitting element 11. The white resin is preferably a resin that contains a white pigment, such as white powder. In particular, a silicone resin containing inorganic white powder, such as titanium oxide, is preferable. Thus, the light emitting module 100 can be produced at a low cost by using a large amount of inexpensive raw materials, such as titanium oxide, as the material which could be used in a relatively large amount to cover one surface of the light guide plate 1.

The above-mentioned light emitting module 100 can be entirely thinned by providing the concave portions 17 in the light guide plate 1 and disposing the light emitters 3 in the respective concave portions 17. Since the concave portions 17 are provided in the light guide plate 1 and each light emitter 3 is disposed in the corresponding concave portion 17, a mounting accuracy of the light emitters 3 on the light guide plate 1 is improved. In particular, the light emitter 3 is formed as an integrated structure of the light emitting element 11 and the light-transmissive member 10 by joining the light emitting element 11 to the wavelength conversion member 12. In addition, by disposing the light emitter 3 with this integrated structure in each concave portion 17 of the light guide plate 1, the mounting accuracy of the wavelength conversion member 12 and the light emitting element 11 on the light guide plate 1 can be improved to achieve excellent emission characteristics. Moreover, the light emitting elements 11, the wavelength conversion members 12, and the light guide plate 1 can be arranged with a high accuracy in the light emitting module 100 that guides the light from the light emitting element 11 to the light guide plate 1 through the wavelength conversion member 12 and emits the light to the outside. Thus, the emission characteristics, such as the unevenness of color and luminance of the light emitted from the light guide plate 1 to the outside, can be improved. Consequently, the light emitting module can achieve excellent emission characteristics.

The light-transmissive bonding member 14 is in contact with the outer side surface of the light-transmissive member 10, the inner side surface of the light guide plate 1, and further the first light reflective member 15 located outside each concave portion 17. Thus, such a bonding member 14 can more efficiently guide the light emitted from the light-transmissive member 10 and propagating toward the second light reflective member 16, to the sides of the light emitter 3, thereby improving the unevenness of luminance. Furthermore, the bonding member 14 can cause more light emitted from the light-transmissive member 10 to enter the light guide plate 1, thereby improving the light extraction efficiency.

In the direct-type liquid crystal display device, since the distance between the liquid crystal panel and the light emitting module is short, the unevenness of luminance or color of the light emitting module may affect unevenness of luminance or color of the liquid crystal display device. For this reason, a light emitting module with the less unevenness of luminance and color has been desired as a light emitting module for the direct-type liquid crystal display device. The configuration of the light emitting module 100 of the present embodiment can reduce the unevenness of luminance and color, while reducing the thickness of the light emitting module 100 to, for example, 5 mm or less, 3 mm or less, 1 mm or less, or the like.

In the embodiments mentioned above, the light emitter 3 includes the wavelength conversion member 12 and the light diffusion portion 13 in the light-transmissive member 10, and a part of the light emitter 3 is disposed in the concave portion 17 of the light guide plate 1, thereby transmitting the light emitted from the light emitting element 11 to the wavelength conversion member 12 and the light diffusion portion 13 to irradiate the light guide plate 1 with the light. It is noted that in the light emitting module, the light-transmissive member of the light emitter does not necessarily include either the wavelength conversion member or the light diffusion portion. For example, the light emitting module may also be configured such that only a wavelength conversion member is provided in the light-transmissive member of the light emitter, and a light diffusion portion is provided at the bottom surface of the concave portion in the light guide plate.

(Manufacturing Steps of Light Emitting Module 100)

Firstly, the light emitter 3 is prepared. Hereinafter, FIGS. 10A to 10C and 11A to 11C show manufacturing steps of the light emitter 3 according to the present embodiment.

Figure 10A:
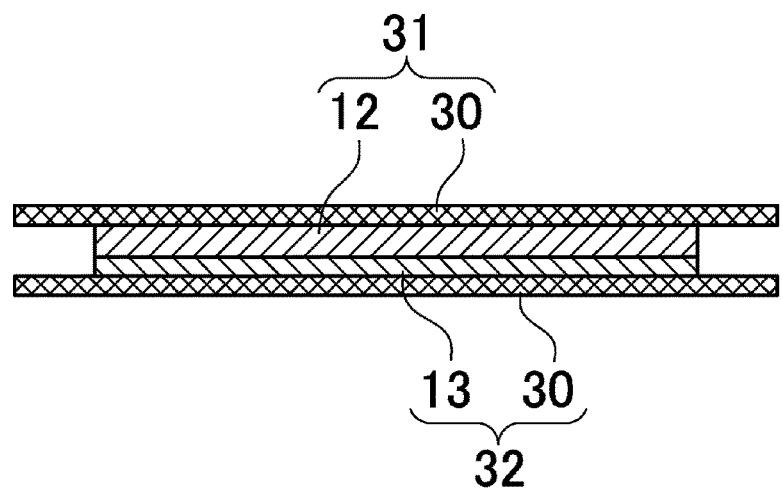
FIGS. 10A, 10B, and 10C are enlarged schematic cross-sectional views showing examples of manufacturing steps of a light emitting module according to an embodiment of the present disclosure.
Figure 10B:
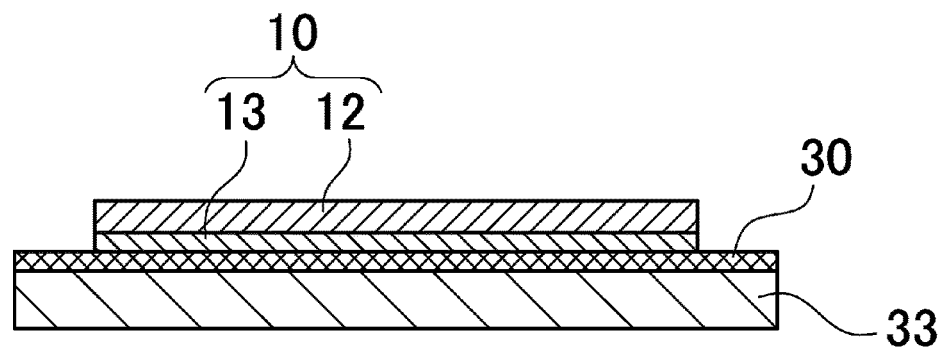

The light-transmissive member 10, which is to cover the main light emitting surface 11c of the light emitting element 11, is formed in the steps shown in FIGS. 10A and 10B. The light-transmissive member 10 shown in the figure is formed as a laminate body composed of the wavelength conversion member 12 and the light diffusion portion 13.

In the step shown in FIG. 10A, a first sheet 31 that includes the wavelength conversion member 12 having a uniform thickness on a surface of a base sheet 30 is laminated on a second sheet 32 that includes the light diffusion portion 13 having a uniform thickness on the surface of another base sheet 30 while the wavelength conversion member 12 is joined to the light diffusion portion 13. In a case where the wavelength conversion member 12 and the light diffusion portion 13 are formed using a thermosetting resin as a base material, these two members, namely, the wavelength conversion member 12 and the light diffusion portion 13 are laminated on each other in a semi-cured state and then cured, so that they can be joined together. The wavelength conversion member 12 and the light diffusion portion 13 may be joined together by a light-transmissive bonding member. Each of the wavelength conversion member 12 and the light diffusion portion 13 may be attached to the corresponding base sheet 30, for example, by an adhesive layer to be peeled off the base sheet 30 via the adhesive layer.

In the step shown in FIG. 10B, the base sheet 30 of the second sheet 32 is placed on a plate 33 in such a manner that the base sheet 30 of the first sheet 31 can be peeled off the plate 33. Then, the base sheet 30 joined to the wavelength conversion member 12 of the first sheet 31 is peeled off the plate 33.

Figure 10C:
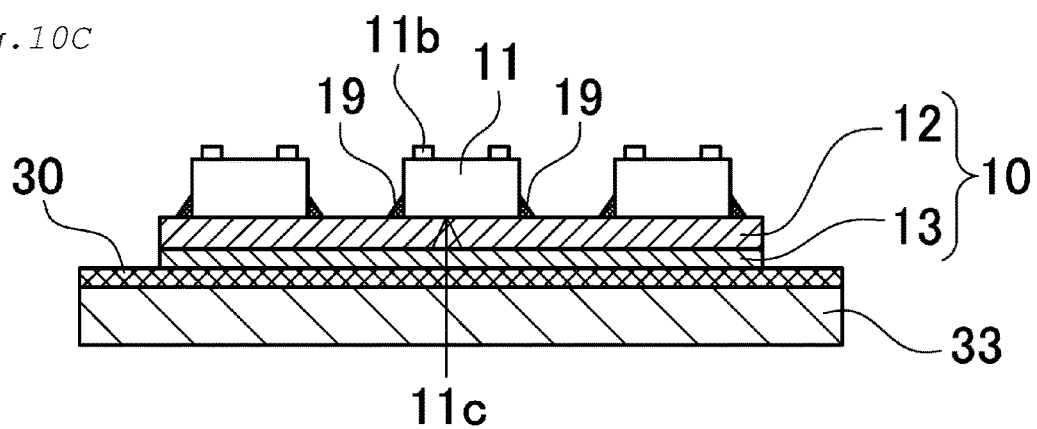

In the step shown in FIG. 10C, the light emitting elements 11 are joined to the light-transmissive member 10. Specifically, the main light emitting surface 11c of each light emitting element 11 is joined to the light-transmissive member 10. When the light-transmissive member 10 is composed of the wavelength conversion member 12 and the light diffusion portion 13, the light emitting elements 11 are joined onto the wavelength conversion member 12 of the light-transmissive member 10, at predetermined intervals.

The light emitting elements 11 are joined to the light-transmissive member 10 by the light-transmissive adhesive member 19. The light-transmissive adhesive member 19 is applied onto the light-transmissive member 10 and/or the main light emitting surface 11c of the light emitting element 11, thereby joining the light emitting element 11 and the light-transmissive member 10 together. At this time, as shown in FIG. 10C, the applied light-transmissive adhesive member 19 creeps up on the side surfaces of each light emitting element 11, whereby the light-transmissive adhesive member 19 covers parts of the side surfaces of the light emitting elements 11. The light-transmissive adhesive member 19 may be disposed between the light-transmissive member 10 and the main light emitting surface 11c of the light emitting element 11.

Figure 11A:
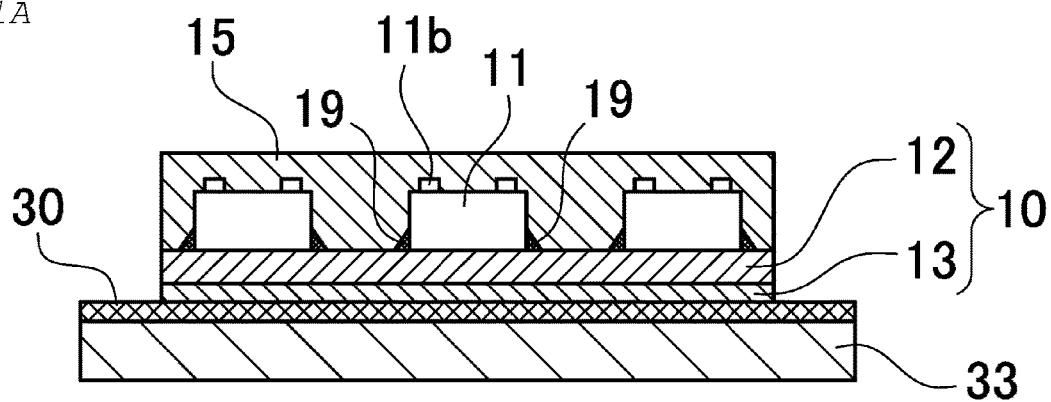
FIGS. 11A, 11B, and 11C are enlarged schematic cross-sectional views showing examples of subsequent manufacturing steps of the light emitting module.
Figure 11B:
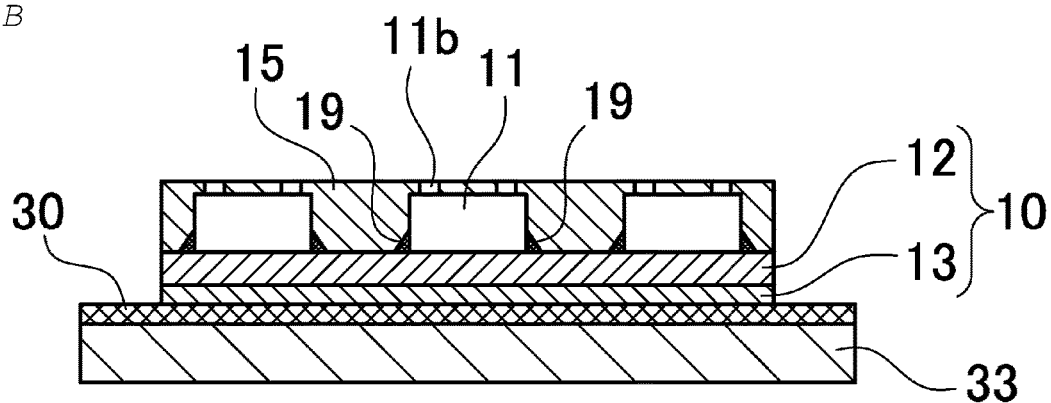
Figure 11C:
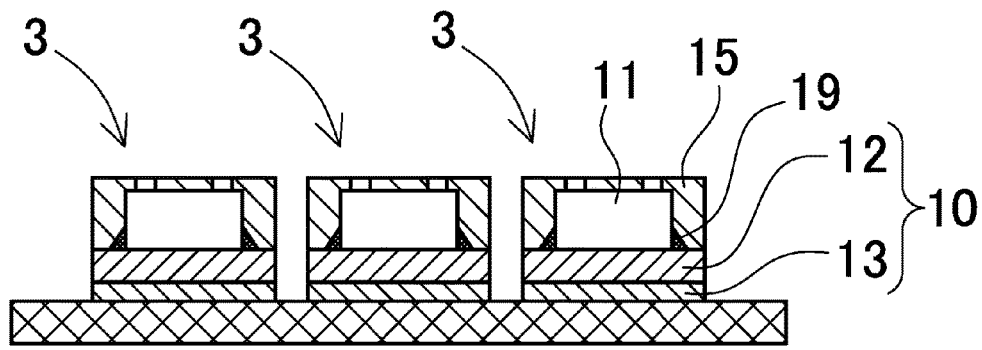

As shown in FIG. 11C, the interval between the adjacent light emitting elements 11 is set at a dimension that forms the outer shape of the light-transmissive member 10 with the predetermined size when cutting a boundary between the adjacent light emitting elements 11. This is because the interval between the light emitting elements 11 specifies the outer shape of the light-transmissive member 10.

In the step shown in FIG. 11A, the first light reflective member 15 is formed to embed therein the light emitting elements 11. The first light reflective member 15 is preferably made of a white resin. The first light reflective member 15 is disposed on the light-transmissive member 10 and cured in a state of embedding therein the light emitting elements 11. The first light reflective member 15 is formed to have a thickness that completely embeds therein the light emitting elements 11, specifically, a thickness that embeds the electrodes 11b of each light emitting element 11 as shown in FIG. 11A. The first light reflective member 15 may be formed by compression molding, transfer molding, coating, or the like.

In the step shown in FIG. 11B, parts of the cured first light reflective member 15 are removed to expose the electrodes 11b of the light emitting elements 11. Furthermore, although not shown, an electrode protection terminal may be formed using a conductive film on the electrode 11b exposed from the first light reflective member 15. In this case, a conductive film made of copper, nickel, gold, or the like is provided on the surface of the first light reflective member 15 by sputtering or the like to connect to the electrodes 11b. Then, parts of the conductive film are removed to leave the conductive film laminated on the electrodes 11b, thereby forming the electrode protection terminal for the light emitter 3. The conductive film can be removed by using dry etching, wet etching, laser ablation, or the like.

In the step shown in FIG. 11C, the first light reflective member 15 and the light-transmissive member 10 are cut to be singulated into the light emitters 3. In each singulated light emitter 3, the light emitting element 11 is joined to the light-transmissive member 10, and the first light reflective member 15 is provided around the light emitter 3 with the electrodes 11b exposed at the surface of the first light reflective member 15.

The preparation of the light emitter may be performed by all or some of the steps mentioned above. Alternatively, the light emitter 3 may be provided by purchase.

The light emitter 3 manufactured in the steps mentioned above is fixed onto the bottom surface of the concave portion 17 in the light guide plate 1 through steps shown in FIGS. 12 to 14.

Firstly, the light guide plate 1 provided with the concave portions 17 on the second main surface 1d is prepared.

Figure 12A:
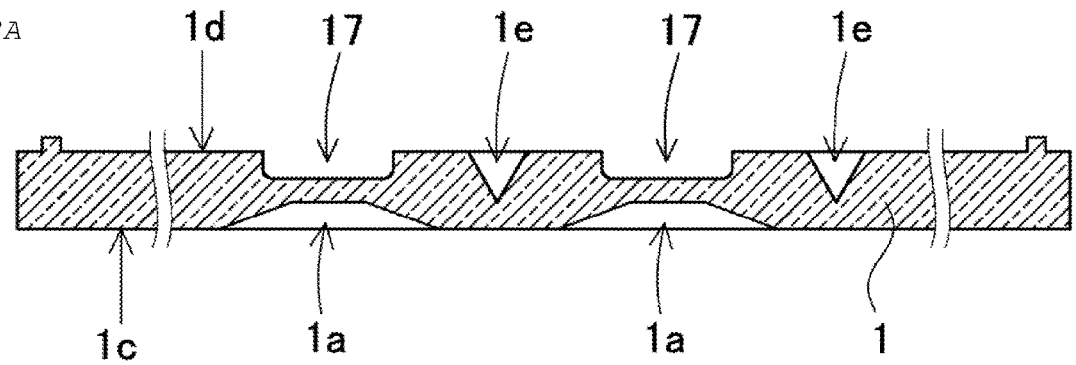
FIGS. 12A, 12B, 12C, and 12D are enlarged schematic cross-sectional views showing examples of subsequent manufacturing steps of the light emitting module.

The light guide plate 1 is made of, for example, a thermoplastic resin, such as a polycarbonate. As shown in FIG. 12A, the concave portions 17 are provided on the second main surface 1d.

The light guide plate 1 can be formed by, for example, an injection molding, a transfer molding, a compression molding, or the like. The light guide plate 1 is formed by a mold into a shape that has the concave portions 17. Such a light guide plate 1 can be mass-produced at a low cost while reducing the misalignment of the concave portion 17. It is noted that the light guide plate can be formed by molding a plate and then providing concave portions in the plate by cutting with a NC machining machine or the like. In addition, the first main surface 1c may also be provided with, for example, a conical optically functional portion(s) 1a.

Figure 12B:
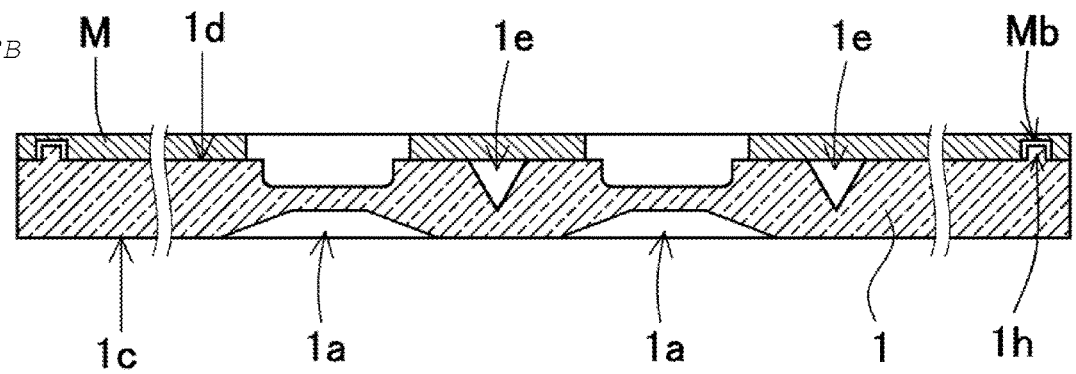

In the step shown in FIG. 12B, a mask M that has openings corresponding to the concave portions 17 of the light guide plate 1 is placed on the second main surface 1d of the light guide plate 1.

The opening of the mask M has the same size and shape as the opening of the concave portion 17 in the light guide plate 1. In an example shown in FIG. 12B, the opening of the mask M is larger than the opening of the concave portion 17. Thus, even when the positional accuracy between the opening of the mask M and the concave portion 17 is low, the bonding member 14 can be easily disposed in the corresponding concave portion 17. The shape of the opening of the mask M is preferably similar to the shape of the opening of the concave portion 17.

Figure 15:
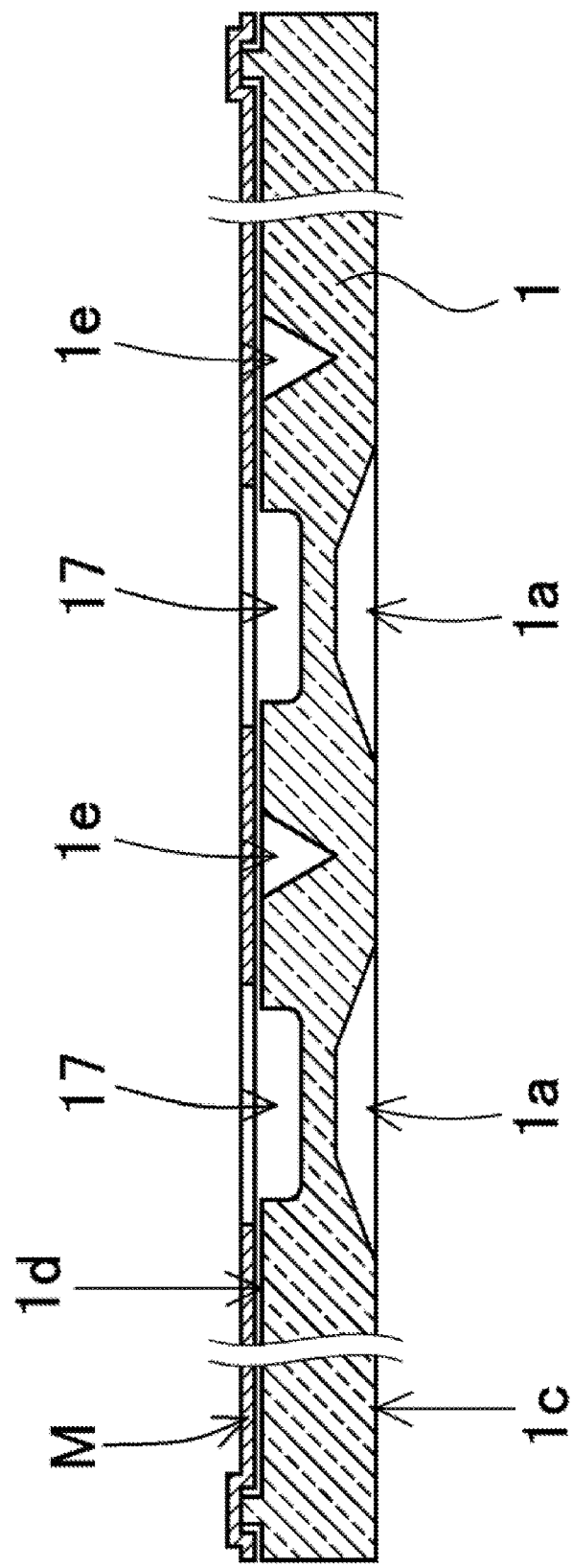
FIG. 15 is a schematic cross-sectional view showing a modification of a mask.

As shown in FIG. 12B, projections 1h are provided at end portions of the light guide plate 1 on the second main surface 1d, and the mask M is provided with fitting portions Mb that correspond to the projections 1h. As shown in FIG. 15, the mask M used may be thinner than the thickness of the projection 1h of the light guide plate 1.

Figure 12C:
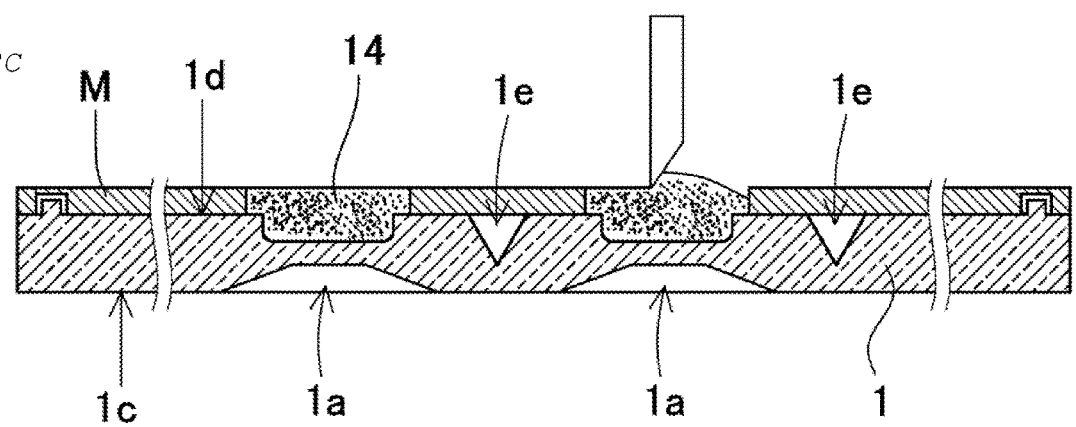

Next, the bonding member 14 which is a fluid paste or liquid in an uncured state is disposed in the openings of the mask M and in the concave portions 17 of the light guide plate 1. Then, as shown in FIG. 12C, by rubbing the bonding member 14 into the openings of the mask M and the concave portions 17 of the light guide plate 1 with a squeegee or the like, the bonding member can be filled into the concave portions 17 with good mass productivity.

When the bonding member 14 is disposed in the concave portions 17, a void may remain between the concave portion 17 and the bonding member 14. Thus, light from the light emitter 3 is reflected or refracted at the interface of the void, which makes it difficult to obtain a light emitting module that has desired optical characteristics. As shown in FIG. 7A, the opening of the concave portion 17 is smaller than the bottom surface of the concave portion in the cross-sectional view. This makes it easier to eliminate voids formed between the concave portion 17 and the bonding member 14, compared with a case where the side surface of the concave portion 17 is formed only by a plane perpendicular to a bottom surface 17a, thereby reducing the unevenness of luminance due to the voids.

Figure 12D:
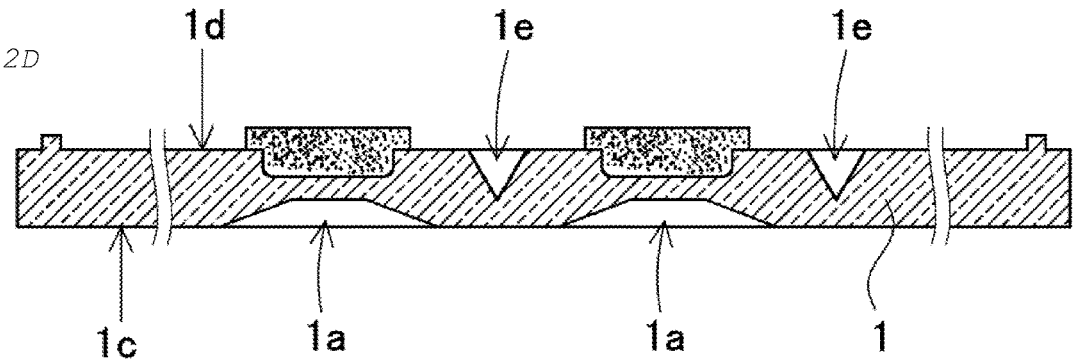

In the step shown in FIG. 12D, the mask is removed.

Figure 13A:
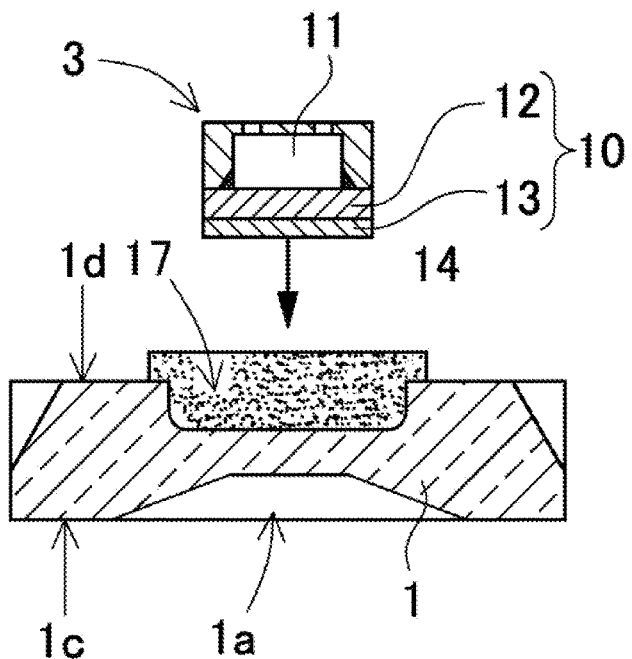
FIGS. 13A, 13B, and 13C are enlarged schematic cross-sectional views showing examples of subsequent manufacturing steps of the light emitting module.
Figure 13B:
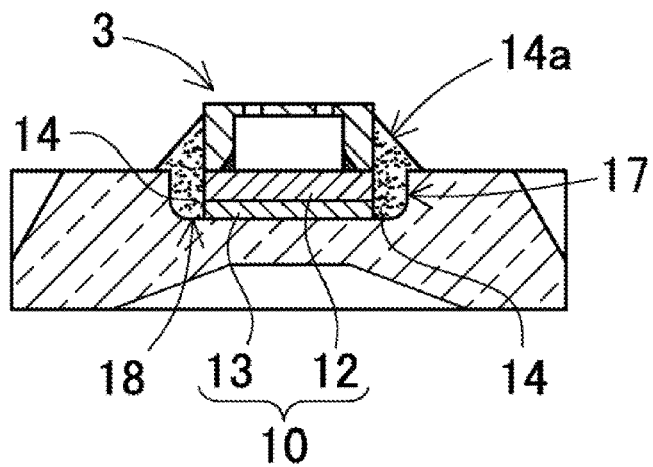

In the steps shown in FIGS. 13A and 13B, a part of the light emitter 3 is disposed in the corresponding concave portion 17 to which the bonding member 14 is applied. More specifically, as shown in FIG. 13B, the light-transmissive member 10 of the light emitter 3 is disposed in each concave portion 17 so as to face the bottom surface of the concave portion 17. A part of the bonding member 14 is located outside the concave portion 17.

The light emitter 3 is disposed such that the center of the light-transmissive member 10 coincides with the center of the concave portion 17 in the planar view. By curing the bonding member 14, each light emitter 3 is joined to the light guide plate 1.

Here, the inner shape of the opening of the concave portion 17 is set larger than the outer shape of the light-transmissive member 10 in the light emitter 3 in the planar view. When a part of the light emitter 3 is disposed in the corresponding concave portion 17, a gap 18 is formed between the inner periphery of the concave portion 17 and the outer periphery of the light-transmissive member 10 in the light emitter 3. The gap 18 is filled with the uncured bonding member 14 applied to the concave portion 17.

In addition, by adjusting the application amount of the bonding member 14 to be applied to the inside of the concave portion 17, the bonding member 14 is pushed out of the gap 18 between the inner side surface of the concave portion 17 and the outer side surface of the light emitter 3 to the outside of the concave portion 17. The bonding member 14 pushed out of the concave portion 17 creeps up to a position in contact with a part of the first light reflective member 15 and covers the part of the first light reflective member 15. Further, the bonding member 14 spreads to a position in contact with the second main surface 1d, so that while the bonding member 14 covers a part of the second main surface 1d, the upper surface of the bonding member 14 forms the inclined surface 14a that extends from the upper end portion of the light emitter 3 toward the outside thereof in the perpendicular cross-sectional view. The inclined surface 14a of the bonding member 14 is formed such that an inclination angle α formed between the outer side surface of the first light reflective member 15 and the inclined surface 14a is an acute angle, and preferably 5° to 50°.

The application amount of the bonding member 14 to be applied to the inside of the concave portion 17 can be set to an amount in which the bonding member 14 covering the outer side surface of the light emitter 3 is higher than the second main surface 1d of the light guide plate 1 with the light emitter 3 joined to the inside of the concave portion 17. That is, the application amount of the bonding member 14 is set to an amount enough for the bonding member 14 to overflow from the concave portion 17 to the outside. It should be noted that the application amount of the bonding member 14 is adjusted such that the position of the inclined surface 14a of the bonding member 14 in contact with the outer side surface of the first light reflective member 15 is lower than the edge of the outer side surface of the light emitter 3 located on the electrode side.

After joining the light emitters 3 to the light guide plate 1, the uncured bonding member 14 may be applied into the gap 18 to extend to the position where it covers a part of the first light reflective member 15. In other words, when a part of the light emitter 3 is disposed in the concave portion 17, the bonding member 14 is applied in an amount enough to be held in the concave portion 17. Thereafter, the bonding member 14 is further applied so as to cover the outer side surface of the light emitter 3, specifically, the outer side surface of the first light reflective member 15. At this time, the application amount of the bonding member 14 is set to one that does not cover the entire outer side surface of the light emitter 3. The bonding member 14 is more preferably applied such that the bonding member 14 covers a part of the second main surface 1d of the light guide plate 1.

Figure 13C:
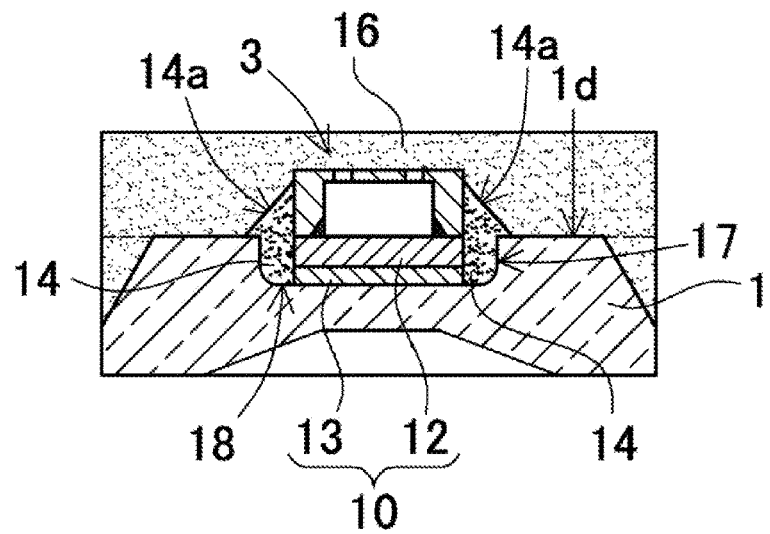

After disposing the light emitters 3 on the light guide plate 1, the second light reflective member 16 is formed at the second main surface 1d of the light guide plate 1 in the step shown in FIG. 13C. The second light reflective member 16 is formed in a thickness that embeds the light emitters 3.

In the step shown in FIG. 14A, a portion of the cured second light reflective member 16 is removed to expose the electrodes 11b at the surface of the second light reflective member 16.

Although the second light reflective member 16 is formed to have the thickness enough to embed therein the light emitters 3 in the step shown in FIG. 13C, the above-mentioned removal step may be omitted by forming the second light reflective member 16 on the same plane as the surface of the electrode 11b or at a lower position than the surface of the electrode lib.

In the step shown in FIG. 14B, a conductive film 24 is laminated on the surfaces of the second light reflective member 16 and the first light reflective member 15. In this step, for example, the conductive film 24 made of Cu/Ni/Au is formed substantially over the entire surfaces of the electrodes 11b of the light emitting element 11, the first light reflective member 15, and the second light reflective member 16 by sputtering or the like.

In the step shown in FIG. 14C, parts of the conductive film 24 between the electrodes 11b are removed.

Through the above-mentioned steps, the light emitting module 100 that includes one or more light emitters 3 disposed on one light guide plate 1 is manufactured.

(Method for Manufacturing Light Emitting Module 200)

A light emitter 3A of the light emitting module 200 shown in FIG. 9 may be manufactured in the following way.

Figure 16A:
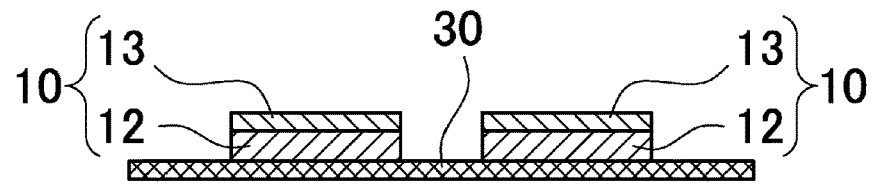
FIGS. 16A, 16B, 16C, and 16D are enlarged schematic cross-sectional views showing examples of manufacturing steps of a light emitter according to another embodiment of the present disclosure.

In the step shown in FIG. 16A, the light-transmissive members 10 are formed. The light-transmissive members 10 shown in the figure may be formed by a laminate body having a predetermined size and composed of the wavelength conversion member 12 and the light diffusion portion 13 laminated on each other.

Figure 16B:
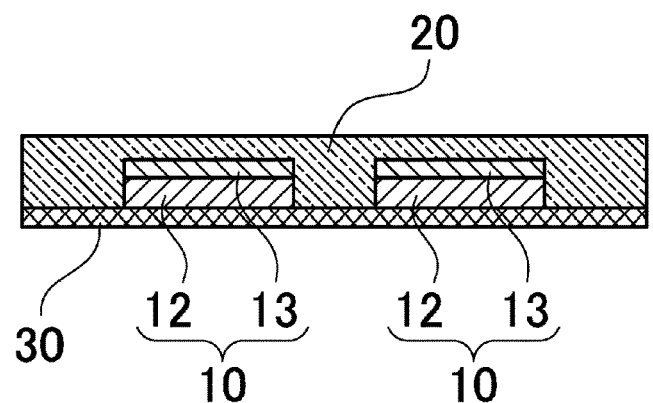
Figure 16C:
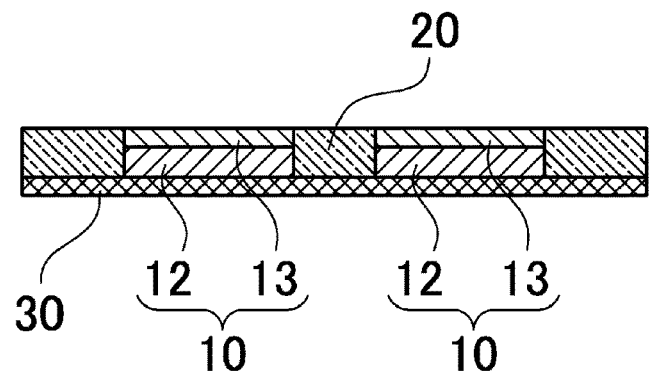

In the step shown in FIG. 16B, the light-transmissive resin portion 20 is formed to embed therein the light-transmissive members 10. In this way, the outer side surfaces of the wavelength conversion member 12 and the light diffusion portion 13 are covered with and protected by the light-transmissive resin portion 20. Thereafter, in the step shown in FIG. 16C, a portion of the cured light-transmissive resin portion 20 is removed to expose the light diffusion portions 13 therefrom.

Figure 16D:
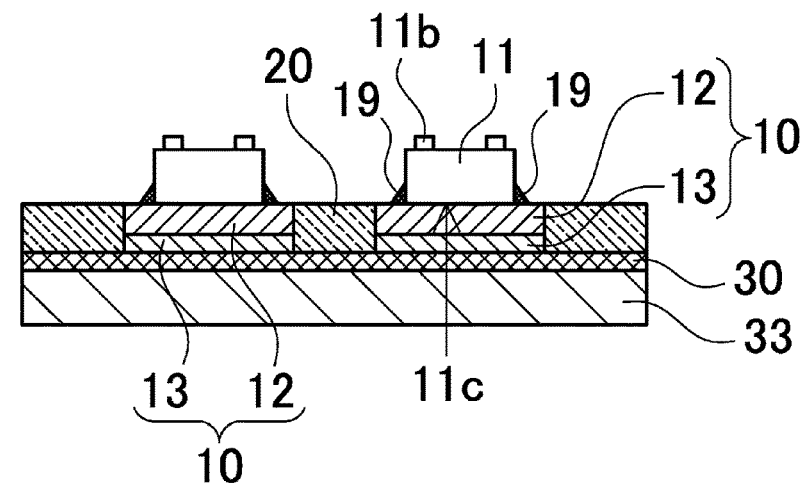

As shown in FIG. 16D, the light-transmissive members 10 are disposed on a base sheet 30 which is placed on a plate 33 such that the light diffusion portions 13 are in contact with the base sheet 30. Thereafter, each light emitting element 11 is joined to the corresponding light-transmissive member 10. The light-transmissive adhesive member 19 is applied on the light-transmissive member 10 and/or the main light emitting surface 11c of the light emitting element 11 to join the main light emitting surface 11c side to the light-transmissive member 10. Each light emitting element 11 is joined onto the wavelength conversion member 12 of one light-transmissive member 10 such that the center of the main light emitting surface 11c of the light emitting element 11 substantially coincides with the center of the light-transmissive member 10 in the top view.

Figure 17A:
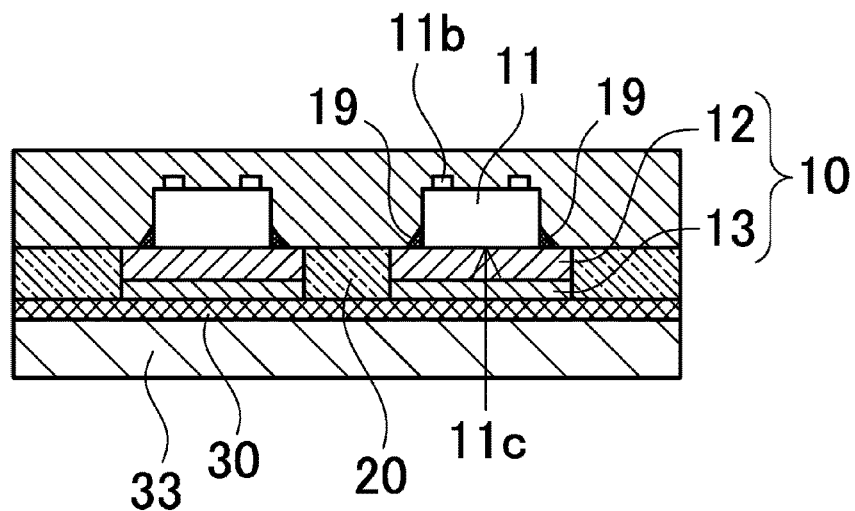
FIGS. 17A, 17B, and 17C are enlarged schematic cross-sectional views showing examples of subsequent manufacturing steps of the light emitter according to another embodiment of the present disclosure.
Figure 17B:
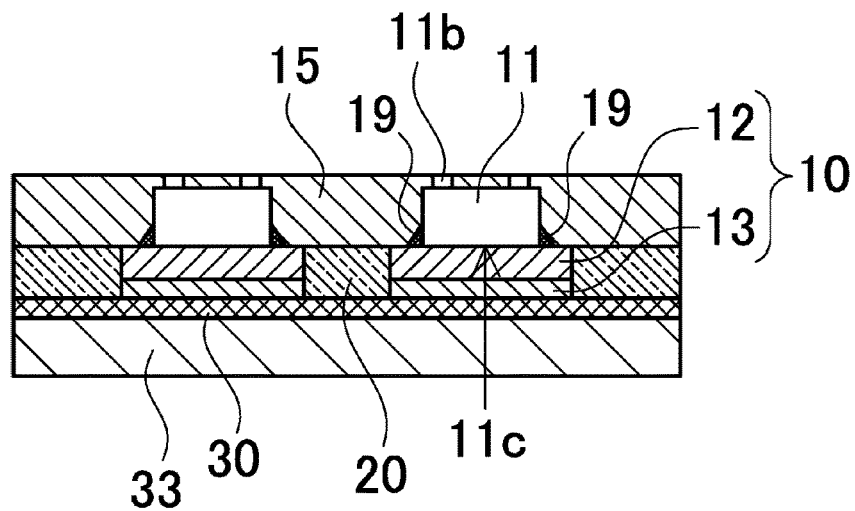

In the step shown in FIG. 17A, the first light reflective member 15 is formed to embed therein the light emitting elements 11. The first light reflective member 15 is applied onto the light-transmissive member 10 and cured in a state of embedding therein the light emitting elements 11. Thereafter, in the step shown in FIG. 17B, a portion of the cured first light reflective member 15 is removed to expose the electrodes 11b of the light emitting elements 11.

Figure 17C:
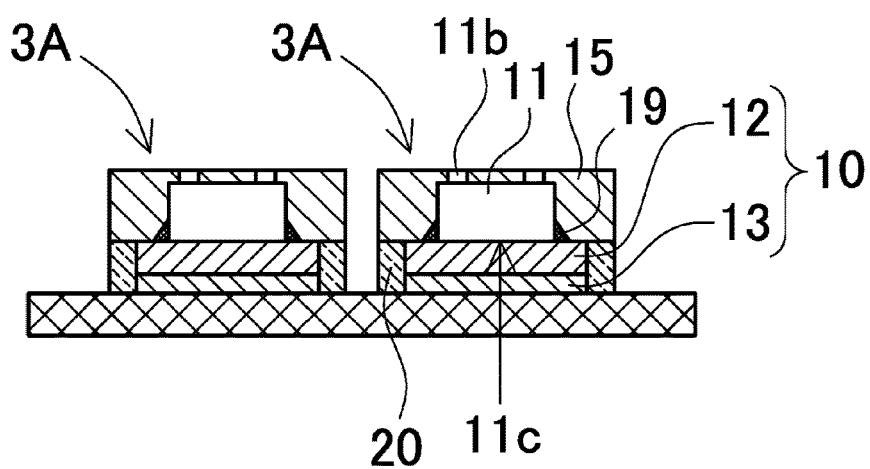

In the step shown in FIG. 17C, the first light reflective member 15 and the light-transmissive member 20 are cut to be singulated into the light emitters 3A. In the singulated light emitter 3A, the light emitting element 11 is joined to the light-transmissive member 10 that includes the laminate body of the wavelength conversion member 12 and the light diffusion portion 13, with the outer peripheral surface of the laminate body being covered with the light-transmissive resin portion 20. Further, the first light reflective member 15 is provided around the light emitting element 11 to expose the electrodes 11b at the surface of the first light reflective member 15.

In the same way as the above-mentioned steps shown in FIGS. 12A to 14C, the light emitter 3A manufactured through the above-mentioned steps is joined to each concave portion 17 of the light guide plate 1, and then the second light reflective member 16 is formed to cover the second main surface 1d of the light guide plate 1 and the light emitter 3A, thus configuring the light emitting module 200.
(Other Manufacturing Methods)

Figure 18A:
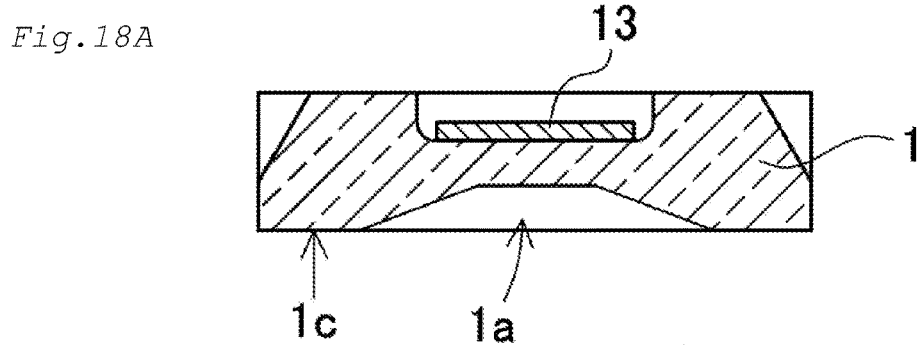
FIGS. 18A, 18B, 18C, and 18D are enlarged schematic cross-sectional views showing examples of manufacturing steps of a light emitter according to another embodiment of the present disclosure.
Figure 18B:
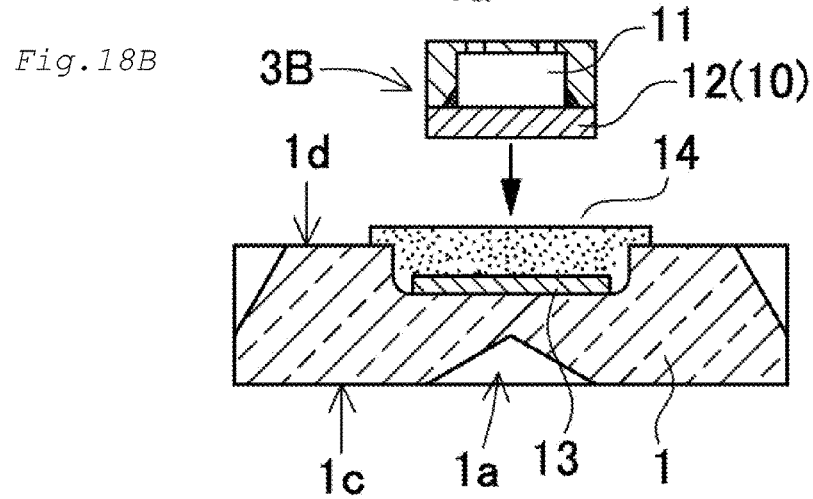
Figure 18C:
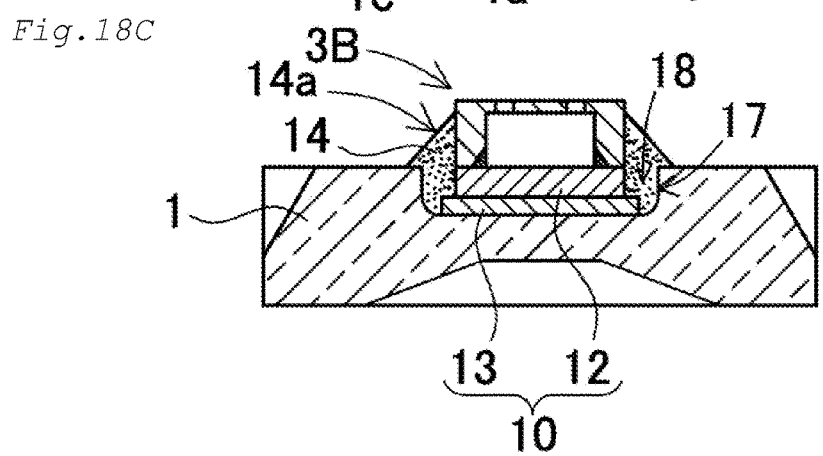
Figure 18D:
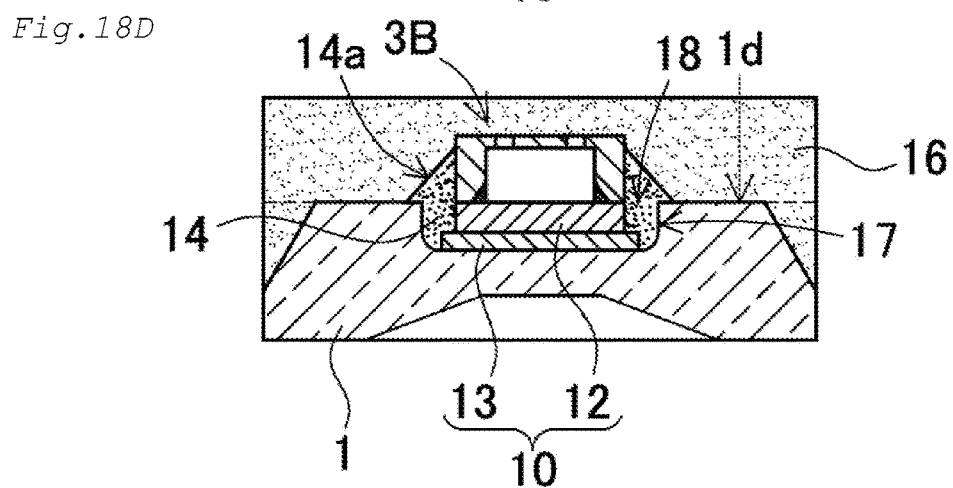
Figure 19:
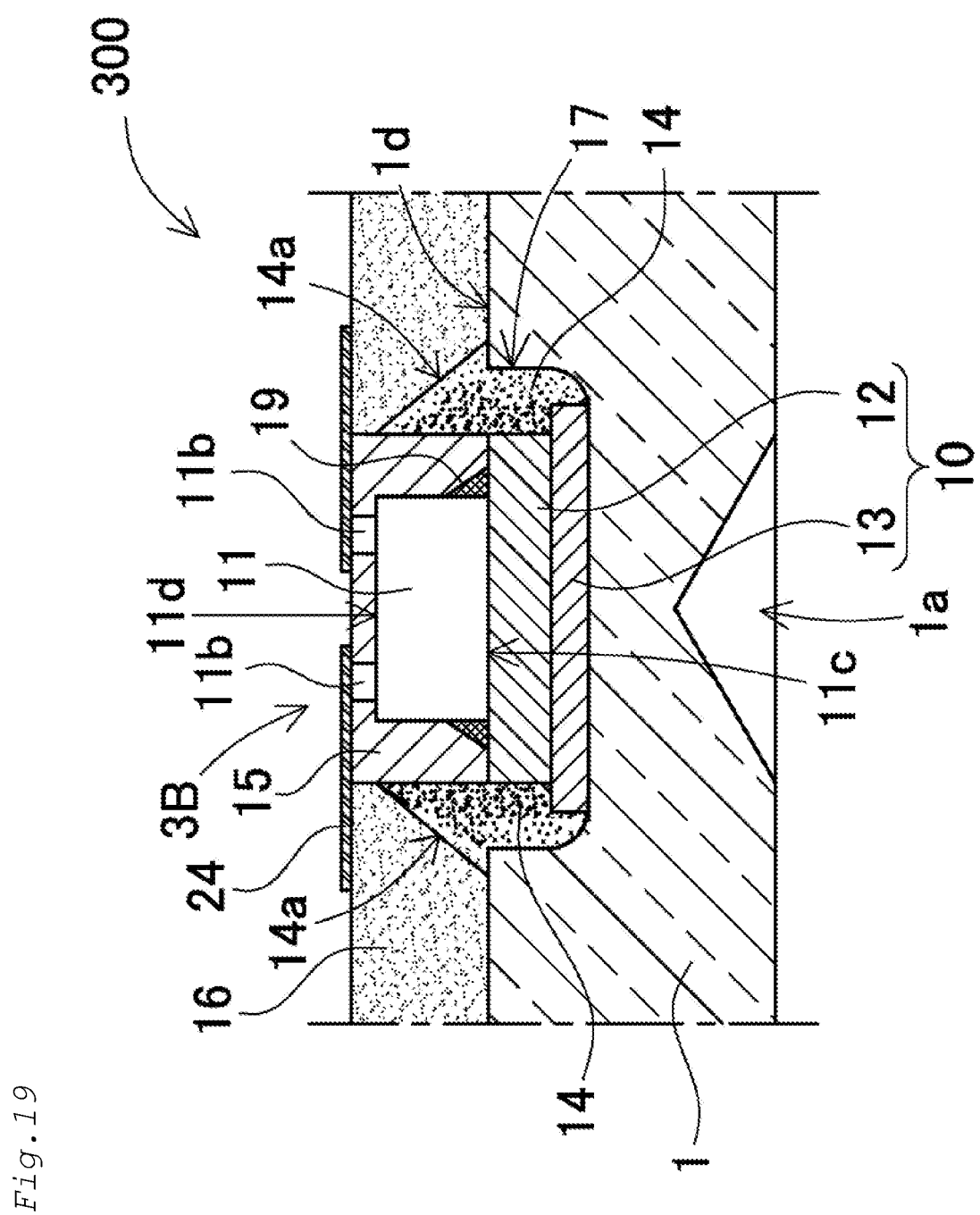
FIG. 19 is an enlarged schematic cross-sectional view of the light emitting module according to another embodiment of the present disclosure.

FIGS. 18A to 18D show manufacturing step of a light emitting module 300 shown in the FIG. 19, in which a light emitter 3B including only the wavelength conversion member 12 as the light-transmissive member 10 is used and joined to the concave portion 17 provided in the light guide plate 1. The light emitting module 300 is manufactured by disposing the light diffusion portion 13 on the bottom surface of the corresponding concave portion 17 in which the light emitter 3B is disposed. After joining the light emitting element 11 to the surface of the wavelength conversion member 12, the first light reflective member 15 is disposed on the surfaces of the wavelength conversion member 12 and the light emitting element 11 in the same way as the step shown in FIGS. 11A to 11C, thereby manufacturing the light emitter 3B in which the light-transmissive member 10 includes only the wavelength conversion member 12.

The light emitting module 300 may be manufactured in the following steps.

In the step shown in FIG. 18A, the light diffusion portion 13 is provided on the bottom surface of the concave portion 17 in the light guide plate 1. The light diffusion portion 13 may be provided by joining a plate-shaped or sheet-shaped light diffusion portion formed with a predetermined size, to the bottom surface of the concave portion 17 or by forming it on the bottom surface of the concave portion 17 through printing, coating, or the like.

As shown in FIG. 18B, the light emitter 3B is joined to the concave portion 17 that has the light diffusion portion 13 provided on its bottom surface. Specifically, the light emitter 3B is arranged in the light guide plate 1 by disposing a part of the light emitter 3B in the concave portion 17 to which the liquid light-transmissive bonding member 14 is applied in an uncured state, in such a manner that the light-transmissive member 10 faces the light diffusion portion 13, and then by curing the bonding member 14.

The uncured bonding member 14 applied to the concave portion 17 is filled into the gap 18 formed between the inner periphery of the concave portion 17 and the outer periphery of the light emitter 3B when the part of the light emitter 3B is disposed in the concave portion 17. At this time, the bonding member 14 is formed by being pushed out to the outside of the concave portion 17. The bonding member 14 pushed out of the concave portion 17 creeps up to a position in contact with a part of the first light reflective member 15 to cover the part of the first light reflective member 15 in the same manner as mentioned above. Further, the upper surface of the bonding member 14 forms the inclined surface 14a that extends from the upper end portion of the light emitter 3 toward the outside thereof in the perpendicular cross-sectional view.

After disposing the light emitters 3 on the light guide plate 1, the second light reflective member 16 is formed at the second main surface 1d of the light guide plate 1 in the step shown in FIG. 18D. The second light reflective member 16 is formed using a white resin in a thickness that embeds therein the light emitters 3.

Subsequently, in the same way as in FIGS. 14A to 14C, after polishing the surface of the second light reflective member 16 to expose the electrodes 11b at the surface of the second light reflective member 16, the conductive film 24 is laminated on the surfaces of the second light reflective member 16 and the first light reflective member 15, and then a part of the conductive film 24 is removed, whereby the light emitting module 300 with the configuration shown in FIG. 19 is manufactured.

The light emitting module 100 of the present embodiment may be wired such that the plurality of light emitters 3 are driven independently of each other. Alternatively, the light guide plate 1 may be divided into a plurality of regions, and a plurality of light emitters 3 mounted in one of the divided regions may be handled as one group. Further, the plurality of light emitters 3 located in one group may be electrically connected in series or in parallel with each other to be connected to the same circuit. The light emitting module may include a plurality of such light emitter groups. By performing such grouping, the light emitting module is provided that enables local dimming.

One light emitting module 100 of the present embodiment may be used as a backlight for one liquid crystal display device. The plurality of light emitting modules 100 may be arranged and used as a backlight for one liquid crystal display device 1000. By fabricating a plurality of small-sized light emitting modules 100 and performing inspection or the like on them, the yield of the light emitting modules 100 can be improved, as compared with the case of fabricating the light emitting module 100 mounted across a large area and having a great number of light emitting elements 11.

Figure 20:
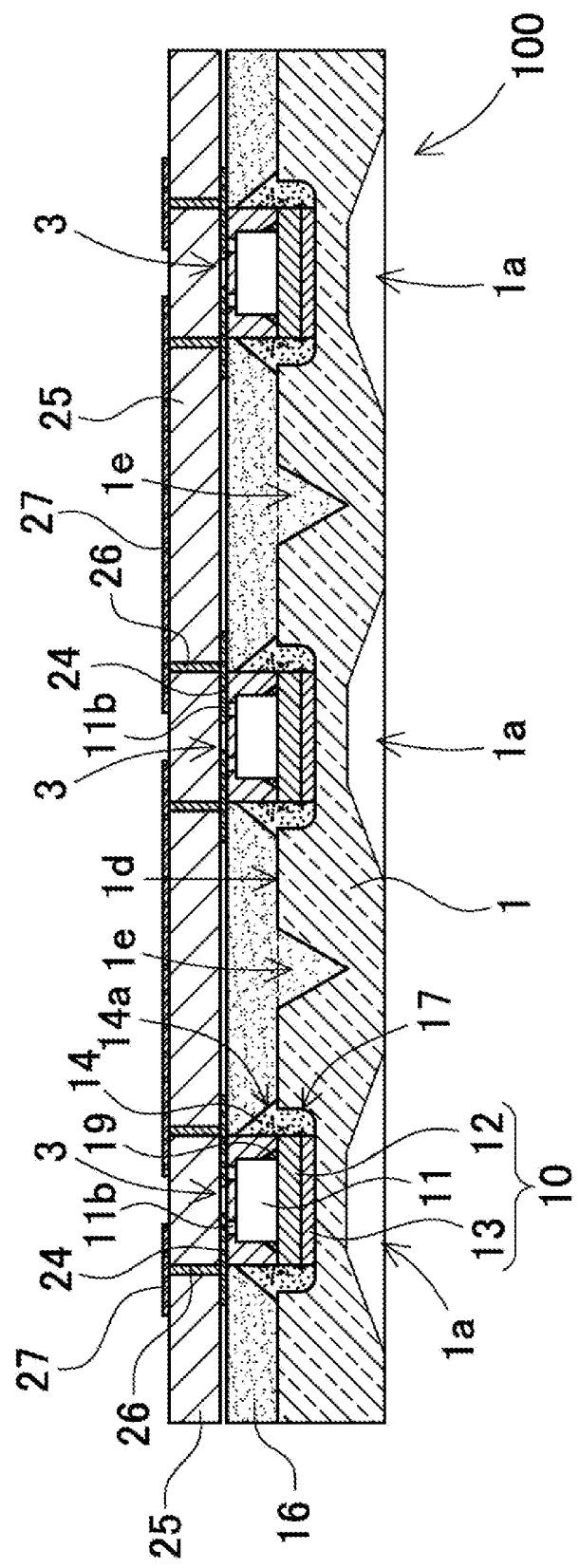
FIG. 20 is an enlarged schematic cross-sectional view showing an example of connecting a circuit board to the light emitting module shown in FIG. 3.

As shown in FIG. 20, the light emitting module 100 may include a wiring board 25. The wiring board 25 may be provided with conductive members 26 filled in a plurality of via holes provided in an insulating base material, and a wiring layer 27 establishing electrical connection to the conductive members 26 at both surfaces of the base material. The electrodes 11b may be electrically connected to the wiring board 25.

It is noted that one light emitting module 100 may be joined to one wiring board. Alternatively, a plurality of light emitting modules 100 may be joined to one wiring board. This can consolidate connection terminals to be used for electric connection with an external unit, into one connection terminal (for example, a connector) (that is, the connection terminal does not need to be prepared for each light emitting module). Thus, the structure of the liquid crystal display device 1000 can be simplified.

A plurality of wiring boards, each having the plurality of light emitting modules 100 joined together thereon, may be arranged side by side to make a backlight for one liquid crystal display device 1000. At this time, for example, the plurality of wiring boards may be placed on a frame or the like and may be connected to an external power source by using the connectors or the like.

It is noted that a light-transmissive member having the function of light diffusion or the like may be further laminated over the light guide plate 1. In such a case, when the optically functional portion 1a is a concave part, a light-transmissive member is preferably provided to cover an opening of the concave part (i.e., a part near the first main surface 1c of the light guide plate 1) and not to fill the concave part. Consequently, an air layer can be provided within the concave part of the optically functional portion 1a, thereby adequately spreading the light from the light emitting element 11.

The light emitting module according to the present disclosure can be suitably used as backlights of televisions, tablets, and liquid crystal displays in televisions, tablets, smartphones, smart watches, head-up displays, digital signage, bulletin boards, and the like. It can also be used as light sources for light fixtures as well as emergency lights, line lighting, various types of illuminations, lights installed in vehicles, and the like.

What is claimed is:

1. A method for manufacturing a light emitting module, comprising:
    preparing a light emitter and a light-transmissive light guide plate, the light emitter comprising a light emitting element, the light guide plate having a first main surface serving as a light emitting surface from which light is emitted outside and a second main surface located opposite to the first main surface and having a concave portion, the concave portion comprising a side surface and a bottom surface that is smaller than an opening of the concave portion in a cross-sectional view;
    fixing the light emitter to the bottom surface of the concave portion via a bonding member; and
    forming a wiring at an electrode of the light emitting element,
    wherein the side surface comprises a curved surface that is convex toward an outside of the concave portion.

2. The method for manufacturing the light emitting module according to claim 1, wherein the side surface further comprises a vertical surface.

3. The method for manufacturing the light emitting module according to claim 1,
    wherein the light emitter comprises the light emitting element and a light-transmissive member covering a main light emitting surface of the light emitting element, and
    wherein the main light emitting surface of the light emitting element is arranged substantially on the same plane as the second main surface of the light guide plate to fix the light emitter to the light guide plate.

4. The method for manufacturing the light emitting module according to claim 3,
    wherein an inner shape of the opening of the concave portion is set larger than an outer shape of the light-transmissive member, and
    wherein the bonding member is filled into a gap between an inner periphery of the concave portion and an outer periphery of the light-transmissive member by disposing the light-transmissive member in the concave portion.

5. The method for manufacturing the light emitting module according to claim 4, wherein the light-transmissive member comprises a wavelength conversion member.

6. The method for manufacturing the light emitting module according to claim 3, wherein the light-transmissive member comprises a wavelength conversion member.

7. The method for manufacturing the light emitting module according to claim 6, wherein the bonding member comprises a wavelength conversion member.

8. The method for manufacturing the light emitting module according to claim 1, wherein the bonding member comprises a wavelength conversion member.

9. A method for manufacturing a light emitting module, comprising:
    preparing a light emitter and a light-transmissive light guide plate, the light emitter comprising a light emitting element, the light guide plate having a first main surface serving as a light emitting surface from which light is emitted outside and a second main surface located opposite to the first main surface and having a concave portion, the concave portion comprising a side surface and a bottom surface that is smaller than an opening of the concave portion in a cross-sectional view;
    fixing the light emitter to the bottom surface of the concave portion via a bonding member; and
    forming a wiring at an electrode of the light emitting element,
    wherein the side surface comprises a plane that is inclined from the bottom surface toward the opening.

10. The method for manufacturing the light emitting module according to claim 9, wherein the side surface further comprises a vertical surface.

11. The method for manufacturing the light emitting module according to claim 9,
    wherein the light emitter comprises the light emitting element and a light-transmissive member covering a main light emitting surface of the light emitting element, and
    wherein the main light emitting surface of the light emitting element is arranged substantially on the same plane as the second main surface of the light guide plate to fix the light emitter to the light guide plate.

12. The method for manufacturing the light emitting module according to claim 9,
    wherein the light emitter comprises the light emitting element and a light-transmissive member covering a main light emitting surface of the light emitting element,
    wherein the main light emitting surface of the light emitting element is arranged substantially on the same plane as the second main surface of the light guide plate to fix the light emitter to the light guide plate,
    wherein an inner shape of the opening of the concave portion is set larger than an outer shape of the light-transmissive member, and
    wherein the bonding member is filled into a gap between an inner periphery of the concave portion and an outer periphery of the light-transmissive member by disposing the light-transmissive member in the concave portion.

13. The method for manufacturing the light emitting module according to claim 9,
    wherein the light emitter comprises the light emitting element and a light-transmissive member covering a main light emitting surface of the light emitting element,
    wherein the main light emitting surface of the light emitting element is arranged substantially on the same plane as the second main surface of the light guide plate to fix the light emitter to the light guide plate, and
    wherein the light-transmissive member comprises a wavelength conversion member.

14. The method for manufacturing the light emitting module according to claim 9, wherein the bonding member comprises a wavelength conversion member.

15. The method for manufacturing the light emitting module according to claim 9,
    wherein the light emitter comprises the light emitting element and a light-transmissive member covering a main light emitting surface of the light emitting element,
    wherein the main light emitting surface of the light emitting element is arranged substantially on the same plane as the second main surface of the light guide plate to fix the light emitter to the light guide plate,
    wherein the light-transmissive member comprises a wavelength conversion member, and
    wherein the bonding member comprises a wavelength conversion member.

16. A method for manufacturing a light emitting module, comprising:
    preparing a light emitter and a light-transmissive light guide plate, the light emitter comprising a light emitting element, the light guide plate having a first main surface serving as a light emitting surface from which light is emitted outside and a second main surface located opposite to the first main surface and having a concave portion, the concave portion comprising a side surface and a bottom surface that is smaller than an opening of the concave portion in a cross-sectional view;
    fixing the light emitter to the bottom surface of the concave portion via a bonding member; and
    forming a wiring at an electrode of the light emitting element,
    wherein the light emitter comprises the light emitting element and a light-transmissive member covering a main light emitting surface of the light emitting element, and
    wherein the main light emitting surface of the light emitting element is arranged substantially on the same plane as the second main surface of the light guide plate to fix the light emitter to the light guide plate.

17. The method for manufacturing the light emitting module according to claim 16,
    wherein an inner shape of the opening of the concave portion is set larger than an outer shape of the light-transmissive member, and
    wherein the bonding member is filled into a gap between an inner periphery of the concave portion and an outer periphery of the light-transmissive member by disposing the light-transmissive member in the concave portion.

18. The method for manufacturing the light emitting module according to claim 16, wherein the light-transmissive member comprises a wavelength conversion member.

19. The method for manufacturing the light emitting module according to claim 16, wherein the bonding member comprises a wavelength conversion member.

20. A method for manufacturing a light emitting module, comprising:
    preparing a light emitter and a light-transmissive light guide plate, the light emitter comprising a light emitting element, the light guide plate having a first main surface serving as a light emitting surface from which light is emitted outside and a second main surface located opposite to the first main surface and having a concave portion, the concave portion comprising a side surface and a bottom surface that is smaller than an opening of the concave portion in a cross-sectional view;
    fixing the light emitter to the bottom surface of the concave portion via a bonding member; and
    forming a wiring at an electrode of the light emitting element,
    wherein the bonding member comprises a wavelength conversion member.

* * * * *